United States Patent
Kamiya et al.

(10) Patent No.: US 11,456,238 B2
(45) Date of Patent: Sep. 27, 2022

(54) SEMICONDUCTOR DEVICE INCLUDING A SEMICONDUCTOR CHIP CONNECTED WITH A PLURALITY OF MAIN TERMINALS

(71) Applicant: DENSO CORPORATION, Kariya (JP)

(72) Inventors: Kosuke Kamiya, Kariya (JP); Ryota Tanabe, Kariya (JP); Tomohisa Sano, Kariya (JP); Takuo Nagase, Kariya (JP); Hiroshi Ishino, Kariya (JP); Shoichiro Omae, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/155,696

(22) Filed: Jan. 22, 2021

(65) Prior Publication Data
US 2021/0143088 A1    May 13, 2021

Related U.S. Application Data

(63) Continuation of application No. PCT/JP2019/021059, filed on May 28, 2019.

(30) Foreign Application Priority Data

Jul. 25, 2018    (JP) .............................. JP2018-139471

(51) Int. Cl.
*H01L 23/495* (2006.01)
*H01L 23/48* (2006.01)
(Continued)

(52) U.S. Cl.
CPC .... *H01L 23/49537* (2013.01); *H01L 21/4871* (2013.01); *H01L 23/3185* (2013.01);
(Continued)

(58) Field of Classification Search
CPC ..... H01L 2924/13055; H01L 2924/181; H01L 24/40; H01L 24/49; H01L 25/072;
(Continued)

(56) References Cited

U.S. PATENT DOCUMENTS 7,728,413 B2 *   6/2010   Iwade ................. H01L 23/3107
                                                         438/122
8,497,572 B2 *   7/2013   Fukutani ................. H01L 24/32
                                                       257/E23.079

(Continued)

FOREIGN PATENT DOCUMENTS

JP       2015-82614 A     4/2015
JP       2016-226131 A    12/2016
WO    WO-2016208122 A1 *  12/2016   ........... H01L 23/367

OTHER PUBLICATIONS

Aug. 13, 2019 Search Report issued in International Patent Application No. PCT/JP2019/021059.

*Primary Examiner* — Alonzo Chambliss
(74) *Attorney, Agent, or Firm* — Oliff PLC

(57) ABSTRACT

A semiconductor device configures one arm of an upper-lower arm circuit, and includes: a semiconductor element that includes a first main electrode and a second main electrode, wherein a main current between the first main electrode and the second main electrode; and multiple main terminals that include a first main terminal connected to the first main electrode and a second main terminal connected to the second main electrode. The first main terminal and the second main terminal are placed adjacent to each other; A lateral surface of the first main terminal and a lateral surface of the second main terminal face each other in one direction orthogonal to a thickness direction of the semiconductor element.

17 Claims, 19 Drawing Sheets

(51) Int. Cl.
  *H01L 23/34* (2006.01)
  *H01L 21/00* (2006.01)
  *H05K 5/02* (2006.01)
  *H01L 23/31* (2006.01)
  *H01L 23/00* (2006.01)
  *H01L 25/07* (2006.01)
  *H01L 25/18* (2006.01)
  *H01L 21/48* (2006.01)
  *H01L 25/065* (2006.01)

(52) U.S. Cl.
  CPC .. *H01L 23/49541* (2013.01); *H01L 23/49575* (2013.01); *H01L 24/40* (2013.01); *H01L 24/49* (2013.01); *H01L 25/0655* (2013.01); *H01L 25/072* (2013.01); *H01L 25/18* (2013.01); *H01L 2224/40137* (2013.01); *H01L 2924/13055* (2013.01); *H01L 2924/183* (2013.01)

(58) Field of Classification Search
  CPC . H01L 25/0655; H01L 21/4871; H01L 28/18; H01L 23/49537; H01L 23/3185; H01L 23/49541; H01L 23/49575; H01L 23/49568
  See application file for complete search history.

(56) References Cited

U.S. PATENT DOCUMENTS

| | | | |
|---|---|---|---|
| 10,777,488 B2* | 9/2020 | Tsuchimochi | H01L 24/32 |
| 10,811,345 B2* | 10/2020 | Muto | H01L 23/3107 |
| 2005/0151236 A1 | 7/2005 | Oliver et al. | |
| 2005/0231925 A1* | 10/2005 | Fukuda | H01L 21/565 |
| | | | 257/E23.044 |
| 2006/0108700 A1* | 5/2006 | Nakazawa | H01L 25/072 |
| | | | 257/E23.092 |
| 2012/0001308 A1* | 1/2012 | Fukutani | H01L 24/32 |
| | | | 438/123 |
| 2013/0181228 A1* | 7/2013 | Usui | H01L 24/40 |
| | | | 257/E21.705 |
| 2016/0133597 A1* | 5/2016 | Kouno | H01L 23/49568 |
| | | | 257/139 |
| 2018/0130748 A1* | 5/2018 | Ueta | H01L 24/30 |

\* cited by examiner

FIG. 12
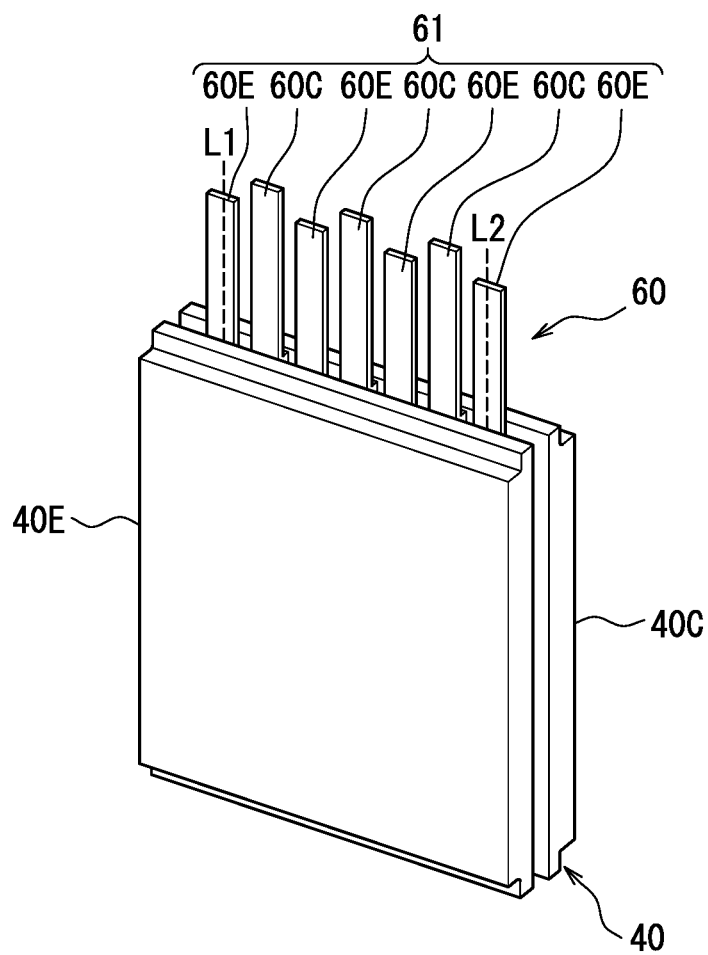
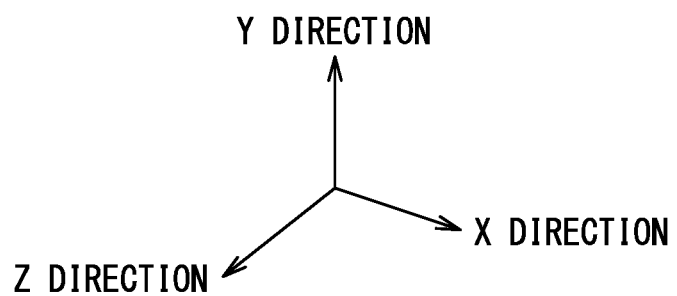

SEMICONDUCTOR DEVICE INCLUDING A SEMICONDUCTOR CHIP CONNECTED WITH A PLURALITY OF MAIN TERMINALS

CROSS REFERENCE TO RELATED APPLICATIONS

The present application is a continuation application of International Patent Application No. PCT/JP2019/021059 filed on May 28, 2019, which designated the U.S. and claims the benefit of priority from Japanese Patent Application No. 2018-139471 filed on Jul. 25, 2018. The entire disclosures of all of the above applications are incorporated herein by reference.

TECHNICAL FIELD

The present disclosure relates to a semiconductor device.

BACKGROUND

In a comparative example, a semiconductor device configures one arm of an upper-lower arm circuit. The semiconductor device includes a semiconductor element having a first main electrode and a second main electrode, a first main terminal connected to the first main electrode, and a second main terminal connected to the second main electrode.

SUMMARY

A semiconductor device may configure one arm of an upper-lower arm circuit, and may include: a semiconductor element that may include a first main electrode and a second main electrode, wherein a main current between the first main electrode and the second main electrode; and multiple main terminals that may include a first main terminal connected to the first main electrode and a second main terminal connected to the second main electrode. The first main terminal and the second main terminal may be placed adjacent to each other; A lateral surface of the first main terminal and a lateral surface of the second main terminal may face each other in one direction orthogonal to a thickness direction of the semiconductor element.

BRIEF DESCRIPTION OF DRAWINGS

The above and other features and advantages of the present disclosure will be more clearly understood from the following detailed description with reference to the accompanying drawings. In the accompanying drawings.

FIG. 12 is a perspective view showing a fourth modification;

DETAILED DESCRIPTION

Figure 1:
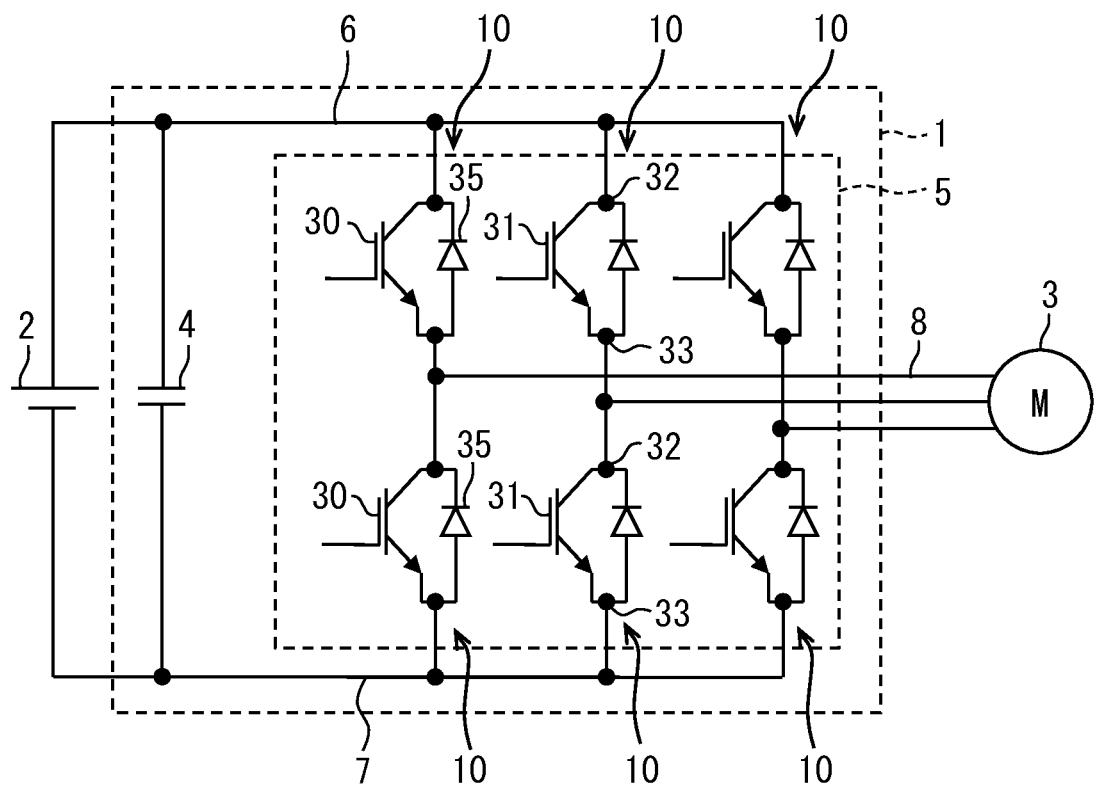
FIG. 1 is a diagram showing a schematic configuration of an electric power conversion device to which a semiconductor device according to a first embodiment is applied.

A semiconductor device includes one first main terminal and one second main terminal. The first main terminal and the second main terminal are arranged in one direction orthogonal to a thickness direction of a semiconductor element, specifically, a plate thickness direction of the main terminal. Not plate surfaces but lateral surfaces of the first main terminal and the second main terminal face each other. Although a wiring inductance of a main circuit can be reduced by such a facing arrangement, the lateral surface is smaller than the plate surface. It is required to further reduce the inductance.

One example of the present disclosure further reduces an inductance in a semiconductor device configuring one arm of an upper-lower arm circuit as compared with a comparative example.

According to one example embodiment, a semiconductor device configures one arm of an upper-lower arm circuit. The semiconductor device includes: at least one semiconductor element that includes a first main electrode and a second main electrode, wherein a main current between the first main electrode and the second main electrode; and multiple main terminals that include a first main terminal connected to the first main electrode and a second main terminal connected to the second main electrode. At least one of a numerical number of the first main terminal or a numerical number is plural. The first main terminal and the second main terminal are placed adjacent to each other. A lateral surface of the first main terminal and a lateral surface of the second main terminal face each other in one direction orthogonal to a thickness direction of the semiconductor element. A main terminal group includes multiple main terminals continuously arranged in the one direction among the multiple main terminals. The multiple main terminals in the main terminal group is three or more. At least a part of each of the multiple main terminals in the main terminal group is placed in a region in an extension line extending, in the one direction, from a both end surface of the semiconductor element.

In the semiconductor device, at least one of the number of first main terminals or the number of second main terminals is two or more. The first main terminal and the second main terminal are placed adjacent to each other in one direction. The lateral surfaces of the adjacent first main terminal and the adjacent second main terminal face each other. Since multiple facing portions of the first main terminal and the second main terminal are provided, it may be possible to effectively reduce the inductance.

At least a part of each of the multiple main terminals in the main terminal group is placed in a region in an extension line extending, in the one direction, from a both end surface of the semiconductor element. Accordingly, it may be possible to simplify the current path between the main terminal and the main electrode, and thereby it may be possible to reduce the inductance.

As described above, according to the semiconductor device of the present disclosure, it may be possible to reduce the inductance as compared with the conventional semiconductor device.

According to another example embodiment, a semiconductor device configures one arm of an upper-lower arm circuit. The second main device includes: multiple semiconductor elements that include a first main electrode and a second main electrode, and include at least a first semiconductor element and a second semiconductor element, wherein a main current flows between the first main electrode and the second main electrode; and multiple main terminals that include a first main terminal connected to the first main electrode and a second main terminal connected to the second main electrode. Each of a numerical number of the first main terminal and a numerical number is two or more. The first main terminal and the second main terminal are alternately placed. A lateral surface of the first main terminal and a lateral surface of the second main terminal face each other in one direction orthogonal to a thickness direction of the semiconductor element. The first semiconductor element and the second semiconductor element are arranged in the one direction, and are connected in parallel between the first main terminal and the second main terminal. A main terminal group includes multiple main terminals continuously arranged in the one direction among the multiple main terminals. The multiple main terminals in the main terminal group is two or more. The semiconductor device includes, as the main terminal group, a first group and a second group. At least a part of each of the multiple main terminals in the first group is placed in a region in an extension line extending, in the one direction, from a both end surface of the first semiconductor element. At least a part of each of the multiple main terminals in the second group is placed in a region in an extension line extending, in the one direction, from a both end surface of the second semiconductor element.

In the semiconductor device, each of the number of first main terminals and the number of second main terminals is two or more. The first main terminal and the second main terminal are alternately placed in one direction. The lateral surfaces of the adjacent first main terminal and the adjacent second main terminal face each other. Since multiple facing portions of the first main terminal and the second main terminal are provided, it may be possible to effectively reduce the inductance.

At least a part of each of the multiple main terminals in the first terminal group is placed in a region in an extension line extending, in the one direction, from a both end surface of the first semiconductor element. Accordingly, it may be possible to simplify the current path between the main terminal and the main electrode, and thereby it may be possible to reduce the inductance. At least a part of each of the multiple main terminals in the second terminal group is placed in a region in an extension line extending, in the one direction, from a both end surface of the second semiconductor element. Accordingly, it may be possible to simplify the current path between the main terminal and the main electrode, and thereby it may be possible to reduce the inductance.

As described above, according to the semiconductor device of the present disclosure, it may be possible to reduce the inductance as compared with the conventional semiconductor device.

Hereinafter, multiple embodiments will be described with reference to the drawings. In the embodiments, functionally and/or structurally corresponding parts are denoted by the same reference numerals. In the following description, a thickness direction of a semiconductor element is given as a Z direction and a direction orthogonal to the Z direction is given as an X direction. A direction orthogonal to both of the Z direction and the X direction is shown as a Y direction. Unless otherwise specified, a shape along an XY plane defined by the X direction and the Y direction is a planar shape.

First Embodiment (Schematic Configuration of Electric Power Conversion Device)

An electric power conversion device 1 shown in FIG. 1 is mounted on, for example, an electric vehicle or a hybrid vehicle. The electric power conversion device 1 converts a direct current voltage supplied from a direct current power source 2 mounted on a vehicle into three-phase alternating current, and output the three-phase AC to a motor 3 of the three-phase AC system. The motor 3 functions as a travel driving source of the vehicle. The electric power conversion device 1 can also convert an electric power generated by the motor 3 into a DC and charge the DC electric power source 2. In this manner, the electric power conversion device 1 is capable of performing a bidirectional power conversion.

The electric power conversion device 1 includes a smoothing capacitor 4 and an inverter 5 as a power converter. A positive electrode terminal of the smoothing capacitor 4 is connected to a positive electrode of the DC electric power source 2, which is a high potential side electrode of the DC electric power source 2. A negative electrode terminal of the smoothing capacitor 4 is connected to a negative electrode of the DC electric power source 2, which is a low potential side electrode of the DC electric power source 2. The inverter 5 converts the input DC electric power into a three-phase AC having a predetermined frequency, and outputs the three-phase AC to the motor 3. The inverter 5 converts the AC electric power generated by the motor 3 into a DC electric power.

The inverter 5 includes upper-lower arm circuits for three phases. In the upper-lower arm circuit of each phase, two arms are connected in series between a high potential power source line 6 and a low potential power source line 7. The high potential power source line 6 is a power source line on a positive electrode side, and the low potential power source line 7 is a power source line on a negative electrode side. In the upper-lower arm circuit of each phase, a connection point between the upper arm and the lower arm is connected to an output line 8 to the motor 3.

In the present embodiment, an insulated gate bipolar transistor (hereinafter referred to as an IGBT) is employed as a semiconductor element configuring each arm. A semiconductor device 10 includes an IGBT 30. The IGBT 30 is connected in reverse parallel to a FWD 35 that is a freewheel diode. One arm is configured by one semiconductor device 10. The IGBT 30 has a gate electrode 31.

As the IGBT 30, an n-channel type is employed. In the upper arm, collector electrodes 32 of the IGBTs 30 are electrically connected to the high potential power source line 6. In the lower arm, emitter electrodes 33 of the IGBTs 30 are electrically connected to the low potential power source line 7. The emitter electrodes 33 of the IGBTs 30 in the upper arm and the collector electrodes 32 of the IGBTs 30 in the lower arm are connected to each other.

The electric power conversion device 1 may include a boost converter that boosts the DC voltage supplied from the DC electric power source 2, a drive circuit of the semiconductor element configuring the inverter 5 or the boost converter, and a control circuit that outputs a drive instruction to the drive circuit, and the like in addition to the smoothing capacitor 4 and the inverter 5 that are described above.

(Schematic Configuration of Semiconductor Device)

Figure 2:
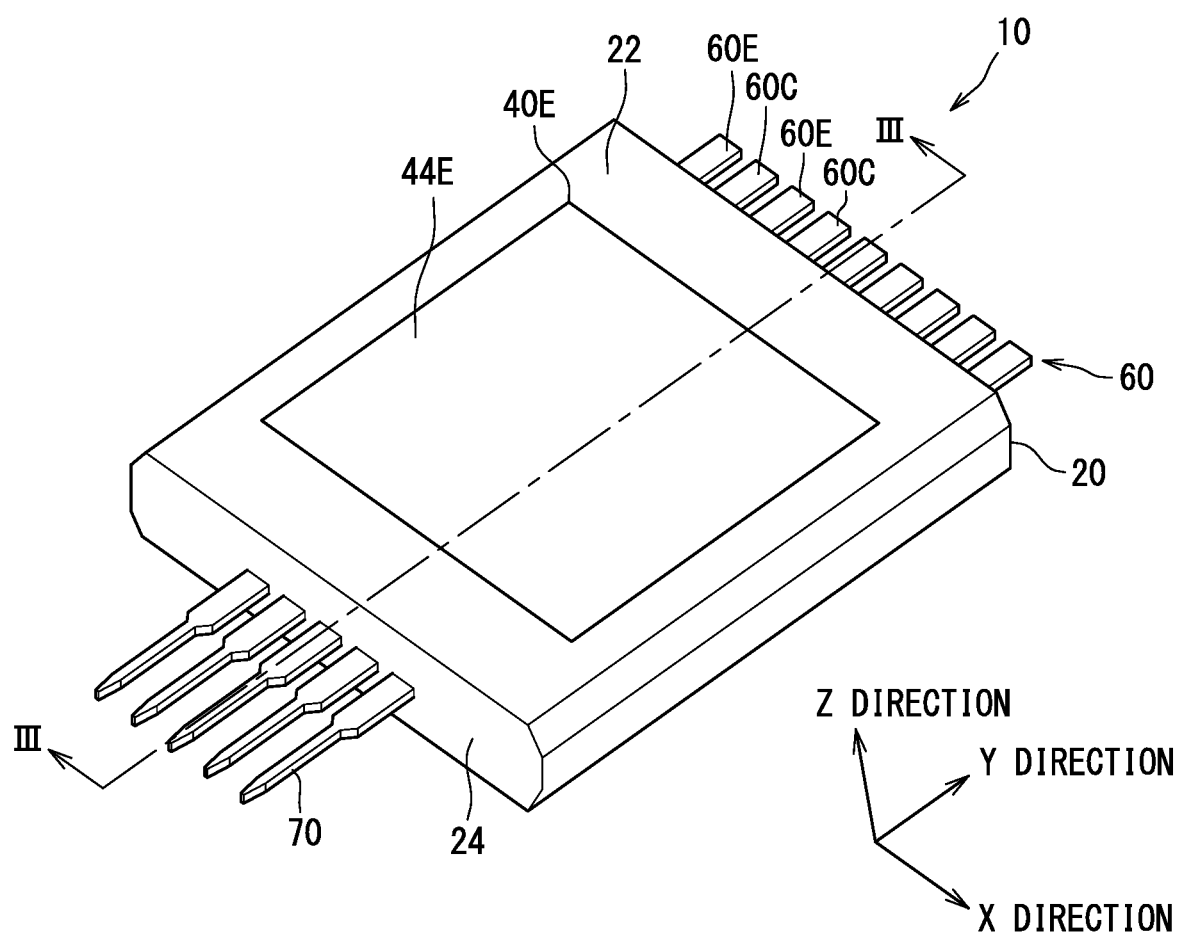
FIG. 2 is a perspective view showing the semiconductor device.
Figure 3:
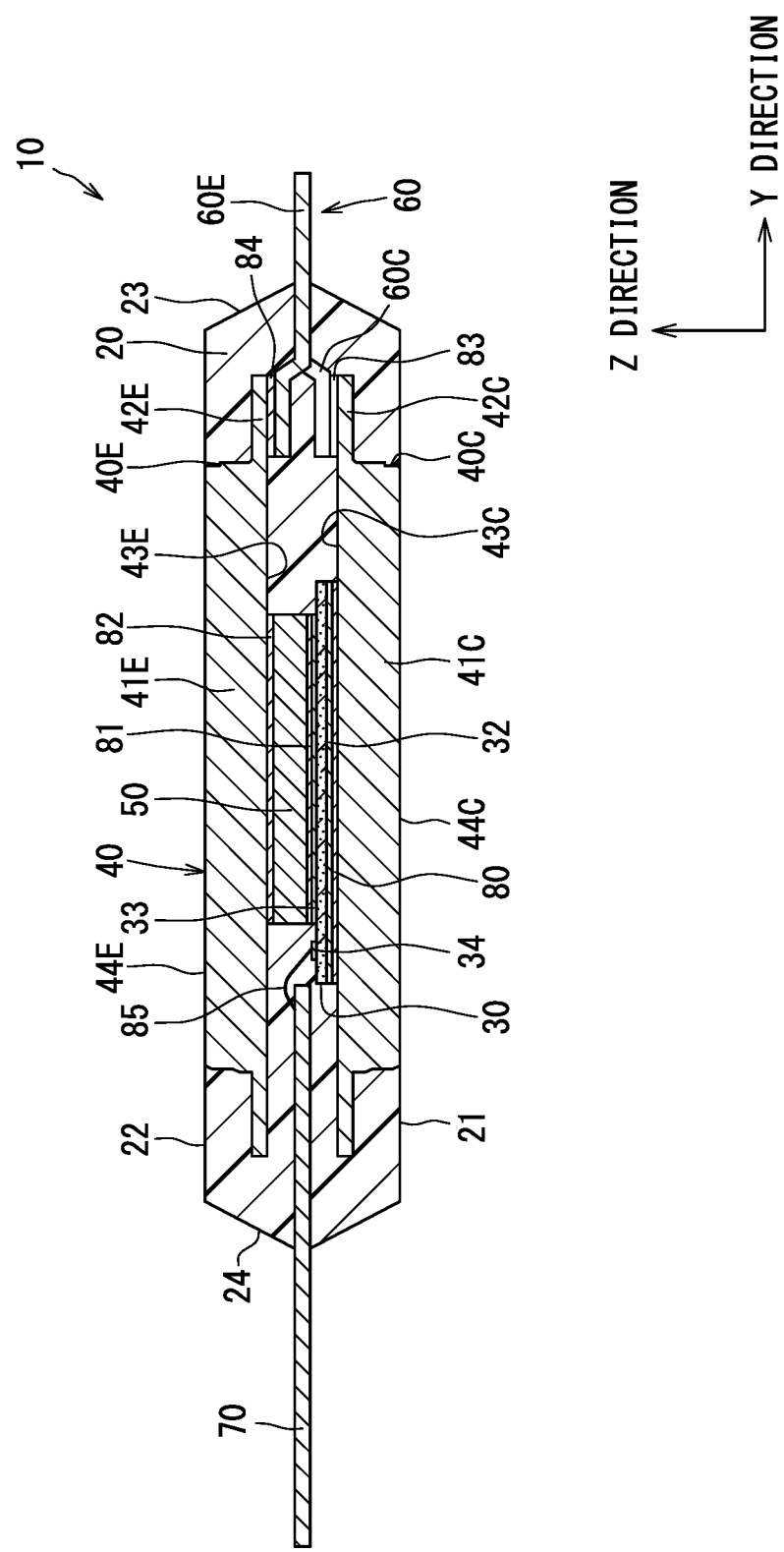
FIG. 3 is a cross-sectional view taken along a line III-III of FIG. 2.
Figure 4:
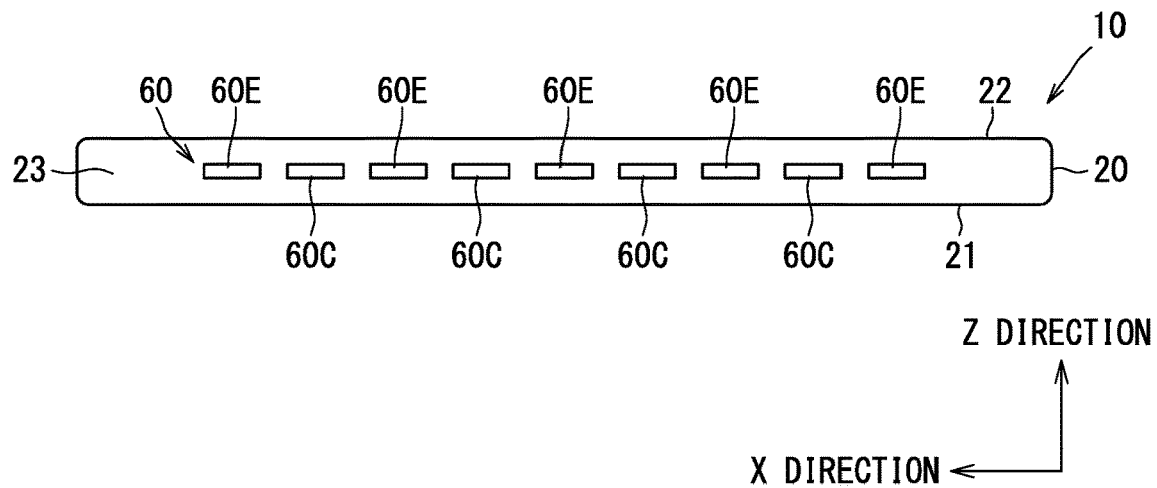
FIG. 4 is a plan view of the semiconductor device seen from a main terminal side.
Figure 5:
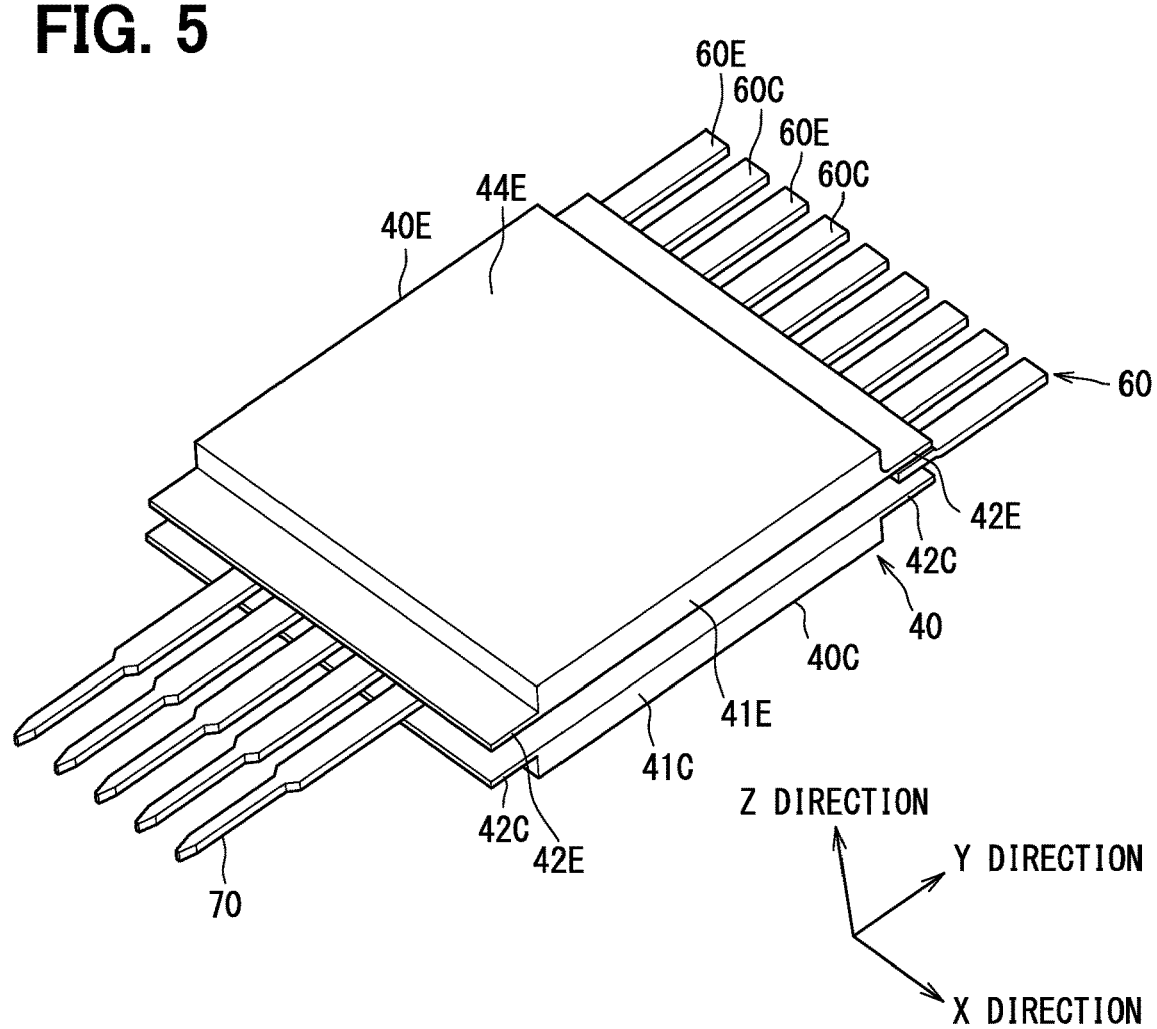
FIG. 5 is a view obtained by omitting a sealing resin body from FIG. 2.
Figure 6:
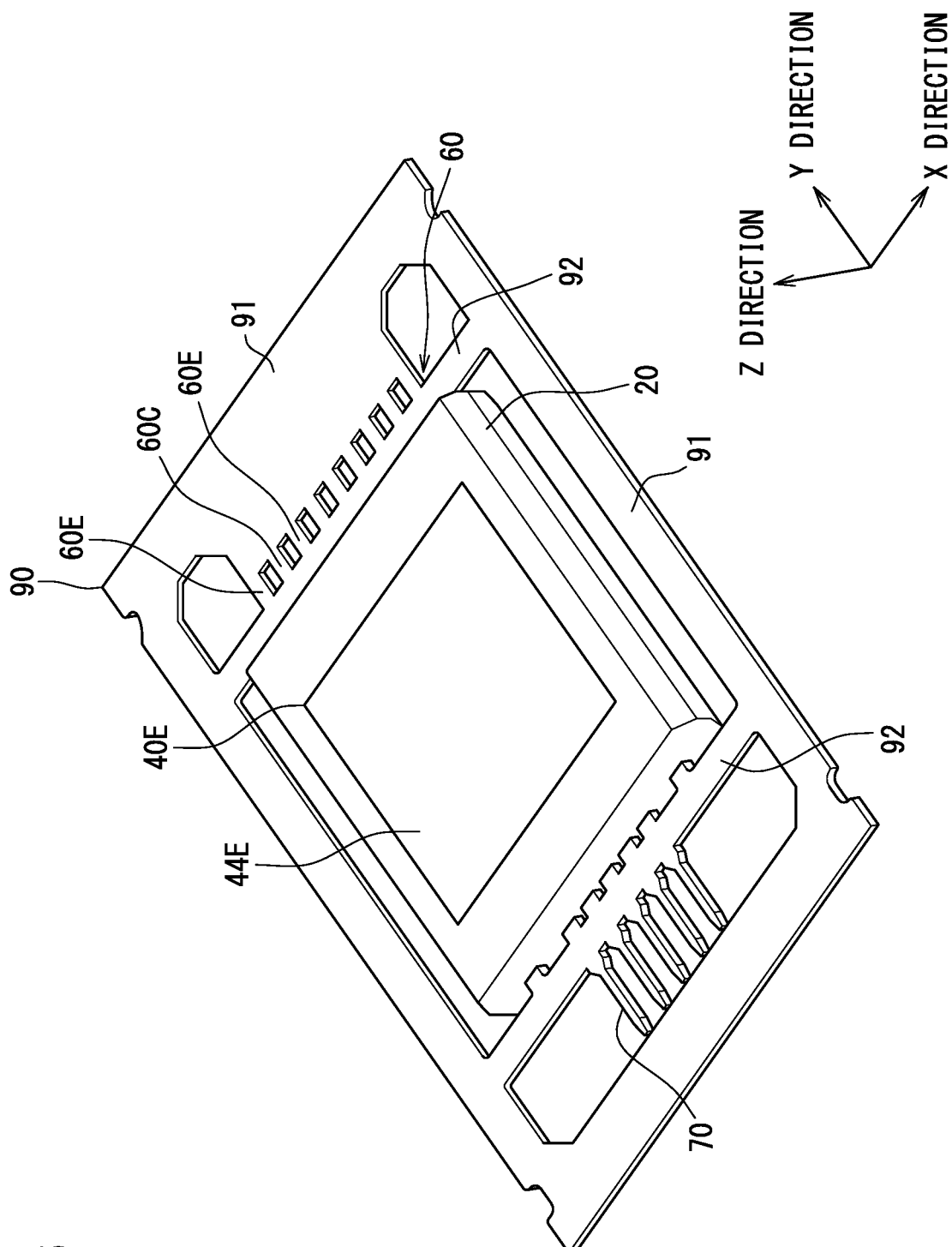
FIG. 6 is a perspective view before an unnecessary portion of a lead frame is cut.
Figure 7:
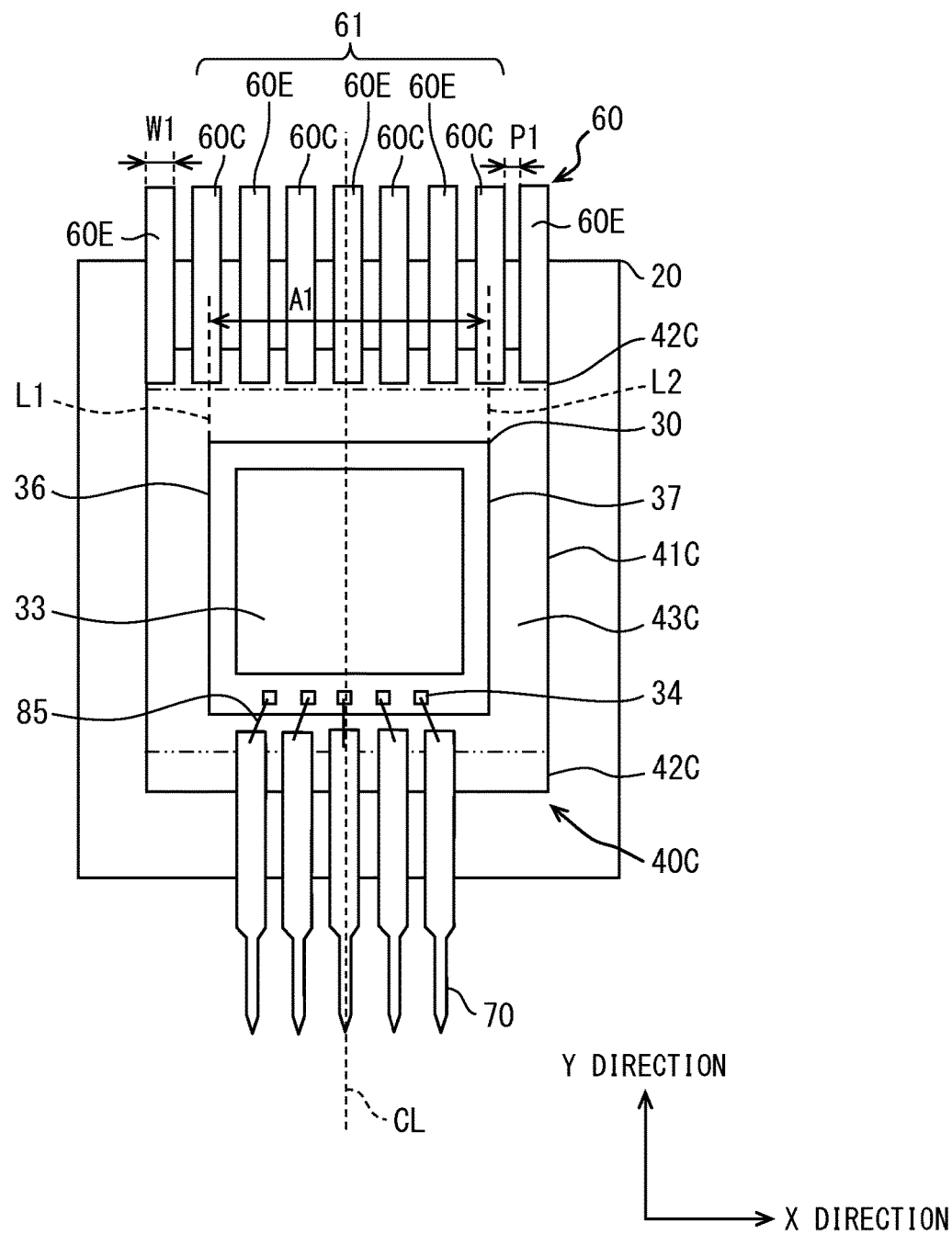
FIG. 7 is a plan view showing a positional relationship between an IGBT and the main terminal.

As shown in FIGS. 2 to 7, the semiconductor device 10 includes a sealing resin body 20, the IGBT 30, a conductive member 40, a terminal 50, a main terminal 60, and a signal terminal 70. FIG. 5 is a view in which the sealing resin body 20 in FIG. 2 is omitted. FIG. 6 shows a state where the sealing resin body 20 was molded and an unnecessary portion of a lead frame 90 is not removed. FIG. 7 is a plan view showing a positional relationship between the IGBT 30 and the main terminal 60. In FIG. 7, a part of the sealing resin body 20, a conductive member 40E, and the terminal 50 are omitted.

The sealing resin body 20 is made of, for example, an epoxy resin. The sealing resin body 20 is molded by, for example, a transfer molding method. As shown in FIGS. 2 to 4, the sealing resin body 20 has a first surface 21 and a second surface 22 opposite to the first surface 21 in the Z direction. The first surface 21 and the second surface 22 are, for example, flat surfaces. The sealing resin body 20 has a lateral surface connecting the first surface 21 and the second surface 22. In the present embodiment, the sealing resin body 20 has a substantially rectangular shape in a plan view.

The IGBTs 30 as semiconductor elements are formed on a semiconductor substrate (semiconductor chip) made of Si, SiC, GaN or the like. The semiconductor device 10 includes one IGBT 30. In the present embodiment, the FWDs 35 are integrally formed with the IGBTs 30, respectively. In other words, RC (Reverse Conducting)-IGBTs are employed as the IGBTs 30.

Each IGBT 30 has a vertical structure so that a main current flows in the Z direction. The IGBT 30 has the gate electrode 31 (not shown). The gate electrode 31 has a trench structure. As shown in FIG. 3, the IGBT 30 has the collector electrode 32 on a first surface side and the emitter electrode 33 on a second surface side opposite to the first surface side in the thickness direction of the IGBT 30, that is, in the Z direction. The collector electrode 32 also serves as a cathode electrode of the FWD 35, and the emitter electrode 33 also serves as an anode electrode of the FWD 35. The collector electrode 32 is formed on almost the entire of one surface. The emitter electrode 33 is formed on a part of a back surface. The collector electrode 32 and the emitter electrode 33 correspond main electrodes. The collector electrode 32 corresponds a first main electrode, and the emitter electrode 33 corresponds to a second main electrode.

As shown in FIG. 3 and FIG. 7, the IGBT 30 has a pad 34 that is an electrode for signal and is placed on a back surface where the emitter electrode 33 is formed. The pad 34 is formed at a position different from the emitter electrode 33. The pad 34 is electrically isolated from the emitter electrode 33. The pad 34 is formed at an end on the side opposite to the formation region of the emitter electrode 33 in the Y direction.

In the present embodiment, each of the IGBTs 30 has five pads 34. Specifically, the five pads 34 are provided for a gate electrode, a Kelvin emitter for detecting a potential of the emitter electrode 33, a current sense, an anode potential of a temperature sensor (temperature sensitive diode) for detecting the temperature of the IGBTs 30, and a cathode potential. The five pads 34 are collectively formed on one end side in the Y direction and are aligned in the X direction in the IGBTs 30 having a substantially rectangular planar shape.

The conductive member 40 electrically relays the IGBT 30 and the main terminal 60. That is, the conductive member 50 functions as a wiring for the main electrode. The conductive member 40 in the present embodiment also has a function of dissipating the heat of the IGBT 30 to the outside of the semiconductor device 10. Therefore, the conductive member 40 is also referred to as a heat sink. The conductive member 40 is formed of at least a metal material such as Cu for securing an electrical conductivity and a thermal conductivity.

The conductive members 40 are provided in pairs so as to sandwich the IGBT 30. Each of the conductive members 40 is placed so as to encompass the IGBT 30 in the projection view from the Z direction. The semiconductor device 10 has, as the pair of the conductive members 40, a conductive member 40C placed close to the collector electrode 32 of the IGBT 30 and a conductive member 40E placed close to the emitter electrode 33. The conductive member 40C electrically relays the collector electrode 32 and a main terminal 60C described later. The conductive member 40E electrically relays the emitter electrode 33 and a main terminal 60E described later.

As shown in FIG. 3, FIG. 5, and FIG. 7, the conductive member 40C has a main portion 41C that is a thick portion in the Z direction and an extension portion 42C that is a portion thinner than the main portion 41C. The main portion 41C has a substantially planar shape having a substantially constant thickness. The main portion 41C has a mounting surface 43C close to the IGBT 30 in the Z direction and a heat radiation surface 44C opposite to the mounting surface 43C. The extension portion 42C extends from the end of the main portion 41C in the Y direction. The extension portion 42C extends in the Y direction with the same length in the X direction, that is, the same width as the main portion 41C. A surface of the extension portion 42C close to the IGBT 30 is substantially flush with the mounting surface 43C of the main portion 41C. An opposite surface far from the IGBT 30 is sealed by the sealing resin body 20. The extension portion 42C may be provided at, at least, the end close to the arrangement position of the main terminal 60. In the present embodiment, the extension portion 42C is placed at each of the both ends of the main portion 41C. In FIG. 7, a boundary between the main portion 41C and the extension portion 42C is shown by a long dashed double-dotted line.

As shown in FIG. 3 and FIG. 5, the conductive member 40E has a main portion 41E that is a thick portion in the Z direction and an extension portion 42E that is a portion thinner than the main portion 41E. The main portion 41E has the substantially planar shape having the substantially constant thickness. The main portion 41E has a mounting surface 43E close to the IGBT 30 in the Z direction and a heat radiation surface 44E opposite to the mounting surface 43C. The extension portion 42E extends from the end of the main portion 41E in the Y direction. The extension portion 42E extends in the Y direction with the same length in the X direction, that is, the same width as the main portion 41E. A surface of the extension portion 42E close to the IGBT 30 is substantially flush with the mounting surface 43E of the main portion 41E. An opposite surface far from the IGBT 30 is sealed by the sealing resin body 20. The extension portion 42E may be provided at, at least, the end close to the arrangement position of the main terminal 60. In the present embodiment, the extension portion 42E is placed at each of the both ends of the main portion 41E. In the present embodiment, common parts are employed as the conductive members 40C and 40E.

The mounting surface 43C in the main portion 41C of the conductive member 40C is connected to the collector electrode 32 of the IGBT 30 via a solder 80. The connection method is not limited to solder joining. Most of the conductive member 40C is covered with the sealing resin body 20. The heat radiation surface 44C of the conductive member 40C is exposed from the sealing resin body 20. The heat radiation surface 44C is substantially flush with the first surface 21. In the surface of the conductive member 40C, a portion other than a connection portion with the solder 80, the heat radiation surface 44C, and a portion that continues from the main terminal 60 is covered with the sealing resin body 20.

The terminal 50 is placed between the IGBT 30 and the conductive member 40E. The terminal 50 has a substantially rectangular shape, and the planar shape (planar substantially rectangular shape) substantially conform with the emitter electrode 33. Since the terminal 50 is positioned in the middle of the electric conductive path between the emitter electrode 33 of the IGBT 30 and the conductive member 40E and the thermal conductive path, the terminal 50 is formed of at least the metal material such as Cu for securing the electric conductivity and the thermal conductivity. The terminal 50 is placed to face the emitter electrode 33 and is connected to the emitter electrode 33 via a solder 81. The connection method is not particularly limited to solder joining. The terminal 50 may be configured as a part of the lead frame 90 described later.

The mounting surface 43E in the main portion 41E of the conductive member 40E is electrically connected to the emitter electrode 33 of the IGBT 30 via a solder 82. Specifically, the conductive member 40E and the terminal 50 are connected via the solder 82. The emitter electrode 33 and the conductive member 40E are electrically connected via the solder 81, the terminal 50, and the solder 82. Most of the conductive member 40E is covered with the sealing resin body 20. The heat radiation surface 44E of the conductive member 40E is exposed from the sealing resin body 20. The heat radiation surface 44E is substantially flush with the second surface 22. In the surface of the conductive member 40E, a portion other than a connection portion with the solder 82, portions that continue from the heat radiation surface 44E and the main terminal 60 is covered with the sealing resin body 20.

The main terminal 60 is a terminal through which a main current flows among external connection terminals for electrically connecting the semiconductor device 10 and an external device. The semiconductor device 10 includes the multiple main terminals 60. The main terminal 60 is connected to the corresponding conductive member 40. By processing the same metal member, the main terminal 60 may be integrally placed with the conductive member 40. The main terminal 60 as the different member may be connected, and thereby may continue from the conductive member 40. In the present embodiment, as shown in FIG. 6, the main terminal 60 is configured as a portion of the lead frame 90 together with the signal terminal 70, and is a member different from the conductive member 40. As shown in FIG. 3, the main terminal 60 is connected to the corresponding conductive member 40 in the sealing resin body 20.

As shown in FIG. 3 and FIG. 4, each of the main terminals 60 extends from the corresponding conductive member 40 in the Y direction, and protrudes from one lateral surface 23 of the sealing resin body 20 to the outside. The main terminals 60 extend in and out of the sealing resin body 20. The main terminals 60 are electrically connected to the main electrodes of the IGBTs 30. The semiconductor device 10 has, as the main terminals 60, the main terminal 60C electrically connected to the collector electrode 32 and the main terminal 60E electrically connected to the emitter electrode 33. The main terminal 60C corresponds to a first main terminal, and the main terminal 60E corresponds to a second main terminal. The main terminal 60C is also referred to as a collector terminal, and the main terminal 60E is also referred to as an emitter terminal.

The main terminal 60C is connected to the conductive member 40C. Specifically, the main terminal 60C is connected to a surface of one extension portion 42C via a solder 83, the one surface being close to the IGBT 30. The connection method is not particularly limited to solder joining. The main terminal 60C extends in the Y direction from the conductive member 40C and protrudes outward from the lateral surface 23 of the sealing resin body 20. The main terminal 60E is connected to the conductive member 40E. Specifically, the main terminal 60E is connected to a surface of one extension portion 42E via a solder 84, the one surface being close to the IGBT 30. The connection method is not particularly limited to solder joining. The main terminal 60E extends from the conductive member 40E in the Y direction that is the same direction as that of the main terminal 60C, and protrudes outward from the same lateral surface 23 as that of the main terminal 60C, as shown in FIGS. 3 and 4. Details of the main terminals 60C and 60E will be described later.

The signal terminals 70 are connected to the pads 34 of the corresponding IGBT 30. The semiconductor device 10 includes the multiple signal terminals 70. In the present embodiment, the multiple signal terminals are connected via a bonding wire 85. The signal terminal 70 is connected to the bonding wire 85 inside the sealing resin body 20. Five signal terminals 70 connected to the pads 34 extend in the Y direction, and protrude from the lateral surface 23 and a lateral surface 24 opposite to the lateral surface 23 in the sealing resin body 20 to the outside. The signal terminal 70 is configured as a part of the lead frame 90 as described above. The signal terminal 70 may be integrally placed with the conductive member 40C together with the main terminal 60C by processing the same metal member.

The lead frame 90 includes an outer peripheral frame portion 91 and a tie bar 92 in a state before cutting, as shown in FIG. 6. Each of the main terminals 60 and each of the signal terminals 70 are fixed to the outer peripheral frame portion 91 via the tie bar 92. After the sealing resin body 20 is molded, an unnecessary portion of the lead frame 90 such as the outer peripheral frame portion 91 or the tie bar 92 is removed. Thereby, the main terminal 60 and the signal terminal 70 are electrically separated. The semiconductor device 10 is obtained. As the lead frame 90, either a material having a constant thickness or a deformed material having a non-constant thickness can be employed.

In the semiconductor device 10 configured as described above, the sealing resin body 20 integrally seals a part of each of the IGBT 30 and the conductive member 40 and a part of each of the terminal 50, the main terminal 60, and the signal terminal 70. That is, elements configuring one arm are sealed. Therefore, the semiconductor device 10 is also referred to as "1-in-1 package".

The heat radiation surface 44C of the conductive member 40C is substantially flush with the first surface 21 of the sealing resin body 20. The heat radiation surface 44E of the conductive member 40E is substantially flush with the second surface 22 of the sealing resin body 20. The semiconductor device 10 has a double-sided heat radiation structure in which the heat radiation surfaces 44C and 44E are both exposed from the sealing resin body 20. The semiconductor device 10 can be formed, for example, by cutting the conductive member 40 together with the sealing resin body 20. The heat radiation surfaces 44C and 44E can also be formed by molding the sealing resin body 20 so as to be in contact with a cavity wall surface of a mold for molding the sealing resin body 20.

(Details of Main Terminal)

The main terminal 60 includes at least one of the main terminal 60C or the main terminal 60E. The main terminal 60C and the main terminal 60E are arranged in the X direction that is the plate width direction of the main terminal 60 so that plate surfaces of the main terminal 60C and the main terminal 60E do not face each other and lateral surfaces of the main terminal 60C and the lateral surface of the main terminal 60E face each other. The semiconductor device 10 includes multiple lateral surface facing portions formed by the adjacent main terminals 60C and 60E. The plate surface is a surface in the plate thickness direction of the main terminal 60 among the surfaces of the main terminal 60. The lateral surface is a surface that connects the plate surfaces and is along the extension direction of the main terminal 60. The remaining surfaces of the main terminal 60 are both end surfaces in the extension direction, that is, a protrusion tip surface and a rear end surface. At least a part of the lateral surfaces configuring the lateral surface facing portion may face with each other in the plate thickness direction of the main terminal 60. For example, the lateral surfaces may be placed so as to shift in the plate thickness direction. However, it is more effective to face each other all over.

A plate width direction is orthogonal to the plate thickness direction of the IGBT 30, that is, the Z direction, and the plate width direction (X direction) corresponds to one direction. An area of the lateral surface of the main terminal 60 is smaller than that of the plate surface. The main terminals 60C and the 60E are placed so as to be adjacent to each other. By being adjacent to each other, the main terminal 60C and the main terminal 60E are alternately arranged in a configuration including the multiple main terminals 60C and 60E. The main terminals 60C and 60E are arranged in order.

As shown in FIG. 7, a main terminal group 61 includes three or more main terminals 60 continuously arranged in the X direction. As described above, the main terminals 60C and 60E are arranged next to each other, the main terminal group 61 includes both of the main terminals 60C and 60E, and at least one of the number of main terminals 60C or the number of main terminals 60E is two or more. At least a part of each main terminal 60 configuring the main terminal group 61 is placed in a predetermined region A1. The region A1 is a region between, in the X direction, an extension line L1 virtually extending from one end surface 36 of the IGBT 30 and an extension line L2 virtually extending from an end surface 37 opposite to the end surface 36. In the X direction, a length between the extension lines L1 and L2 conforms with a width of the IGBT 30, that is, an element width.

In the present embodiment, the main terminals 60C and 60E extend in the same direction (Y direction) over their entire length. The main terminal 60 has a straight plane shape, and does not have an extension portion in the X direction. The thickness of the main terminal 60C is thinner than that of the main portion 41C, and, for example, is almost same as that of the extension portion 42C. The thickness of the main terminal 60E is thinner than that of the main portion 41E, and, for example, is almost same as that of the extension portion 42E. The thickness of the main terminal 60 is, overall, substantially constant, and the main terminals 60C and 60E have substantially the same thickness. A width W1 of the main terminals 60 is, overall, substantially constant, and the main terminals 60C and 60E have the same width. An interval P1 between the adjacent main terminals 60 in the X direction is also the same for all the main terminals 60. The interval P1 is also referred to as an inter-terminal pitch.

Each of the main terminals 60 has two bent portions in the sealing resin body 20. Thereby, the main terminal 60 has a substantially crank shape in a ZY plane. In the main terminal 60, a portion close to the tip as compared with the above-described bent portion has a flat plate shape, and a part of the flat plate shaped portion protrudes from the sealing resin body 20. In the protrusion portion from the sealing resin body 20, that is, the above-described flat plate shaped portion, the main terminals 60C and 60E are placed at substantially the same positions in the Z direction, as shown in FIGS. 3 and 4. In the flat plate shaped portion, the thickness directions of the main terminals 60C and 60E substantially conform with the Z direction. Thereby, almost the entire area of the lateral surface of the main terminal 60C and almost the entire area of the lateral surface of the main terminal 60E face each other in the Z direction. Further, the extension lengths of the flat shaped portions of the main terminals 60C and 60E are substantially the same. The main terminals 60C and the main terminal 60E are placed at substantially the same positions in the Y direction. Thereby, almost the entire areas of the flat shaped portions of the lateral surfaces of the main terminals 60C and 60E face each other.

As shown in FIG. 2, FIGS. 5 to 7, the semiconductor device 10 includes an odd number of main terminals 60, specifically, nine main terminals 60. Four of the nine main terminals 60 are the main terminals 60C, and the remaining five are the main terminals 60E. The main terminals 60C and 60E are alternately placed in the X direction. Thereby, the semiconductor device 10 has eight lateral surface facing portions. At the both ends in the X direction, the main terminals 60E are placed, and the main terminal group 61 includes seven main terminals 60 other than the main terminal 60E placed at the both ends. The main terminal group 61 includes an odd number of (seven) main terminals 60, specifically, four main terminals 60C and three main terminals 60E. The entire area of each of the two main terminals 60E that does not configure the main terminal group 61 is placed outside the region A in the X direction.

The number of main terminals 60 that configures the main terminal group 61 is larger than the number of main terminals 60 that does not configure the main terminal group 61.

Among the seven main terminals 60 included in the main terminal group 61, a part of each of the two main terminals 60C positioned at both ends is placed in the region A1 in the X direction. The entire area of each of the remaining five main terminals 60 is placed in the region A1 in the X direction. In such a manner, some of the main terminals 60 configuring the main terminal group 61 are entirely placed in the region A1, and the remaining main terminals 60 are partially placed in the region A1. In particular, in the present embodiment, each of the multiple (five) main terminals 60 configuring the main terminal group 61 is entirely placed in the region A1.

As described above, the main terminals 60C and 60E have the same width W1, and the interval P1 between the main terminals 60C and 60E is also the same for all the main terminals 60. A center of the width of the main terminal 60E placed at the center in the X direction among the odd number of main terminals 60 is positioned on a center line CL passing through the center of the IGBT 30. In such a manner, the main terminals 60C and 60E are placed symmetrically with respect to the center line CL passing through the center of the IGBT 30 in the X direction. The multiple main terminals 60C are placed symmetrically with respect to the center line CL, and the main terminal 60E are placed symmetrically with respect to the center line CL. The odd number of main terminals 60 included in the main terminal group 61 are placed symmetrically with respect to the center line CL. The extension direction of the center line CL is orthogonal to the Z direction and the X direction.

As described above, in the semiconductor device 10 in the present embodiment, at least one of the number of main terminals 60C or the number of main terminals 60E are multiple, and the main terminals 60C and 60E are placed adjacent to each other in the X direction. The lateral surfaces of the adjacent main terminals 60C and 60E face each other. The direction of the main current at the main terminal 60C is opposite to that at the main terminal 60E. In the such a manner, the main terminals 60C and 60E are placed so as to cancel the magnetic fluxes generated when the main current flows. Therefore, it may be possible to reduce the inductance. In particular, in the present embodiment, the multiple lateral surface facing portions of the main terminals 60C and 60E are provided, it may be possible to effectively reduce the inductance. Since the multiple main terminals 60 having the same type are placed in parallel, it may be possible to reduce the inductance.

The main terminal group 61 includes at least three main terminals 60 continuously arranged. At least a part of each main terminal 60 configuring the main terminal group 61 is placed in the region A1 between, in the X direction, the extension lines L1 and L2 that extend from the both end surfaces 36 and 37 of the IGBT 30. That is, the multiple lateral surface facing portions are placed in the region A1. Thereby, it may be possible to simplify the current path between the main terminal 60 configuring the main terminal group 61 and the main electrode of the IGBT 30, specifically, shorten the current path. Therefore, it may be possible to reduce the inductance.

As described above, according to the semiconductor device 10 in the present embodiment, it may be possible to reduce the inductance of the main circuit wiring as compared with the conventional structure. The multiple main terminals 60 may be arranged in the X direction so that the lateral surfaces face each other. The main terminal group 61 may include at least three main terminals 60. The at least three main terminals 60 may include at least one of the multiple main terminals 60C or the main terminals 60E. Partially, the main terminals 60 having the same type may be continuously arranged. Thereby, since at least one of the multiple main terminals 60C or the multiple main terminal 60E are placed in parallel, it may be possible to reduce the inductance. Since the main terminal group 61 is provided, it may be possible to simplify the current path between the main terminal 60 configuring the main terminal group 61 and the main electrode of the IGBT 30. Thereby, it may be possible to reduce the inductance. Accordingly, the effects in accordance with the present embodiment can be obtained. However, as shown in the present embodiment, since the main terminals 60C and 60E are placed adjacent to each other, it may be possible to further reduce the inductance due to the effect of canceling the magnetic flux.

In the main terminal group 61, the main terminal 60 entirely placed in the region A1 in the X direction is more preferable in respect of the simplification of the current path as compared with the main terminal 60 partially placed in the region A1. In the present embodiment, some of the main terminals 60 configuring the main terminal group 61 are entirely placed in the region A1, and the remaining main terminals 60 are partially placed in the region A1. Since the main terminal group 61 includes the main terminal 60 that is more effective for simplifying the current path, it may be possible to effectively reduce the inductance. In particular, in the present embodiment, the multiple main terminal 60 entirely placed in the area are included. Since the multiple main terminals 60 that are more effective for simplifying the current path are included, it may be possible to more effectively reduce the inductance.

In the present embodiment, the number of main terminals 60 is odd. When the number is odd, it is easy to have symmetry in the X direction, and it may be possible to prevent the bias of the current path between the main terminal 60 and the IGBT 30. The arrangement order of the main terminals 60 in the X direction is the same regardless of the viewpoint from the first surface 21 or the viewpoint from the second surface 22. Accordingly, it may be possible to improve freedom of placement of the semiconductor device 10.

In particular, in the present embodiment, the main terminals 60C and 60E are placed symmetrically with respect to the center line CL of the IGBT 30 in the X direction. Thereby, the main current of the IGBT 30 symmetrically flows with respect to the center line CL. The main current flows almost evenly on the left side and the right side with respect to the center line CL. Accordingly, it may be possible to further reduce the inductance. In addition, it may be possible to suppress local heat generation.

Figure 8:
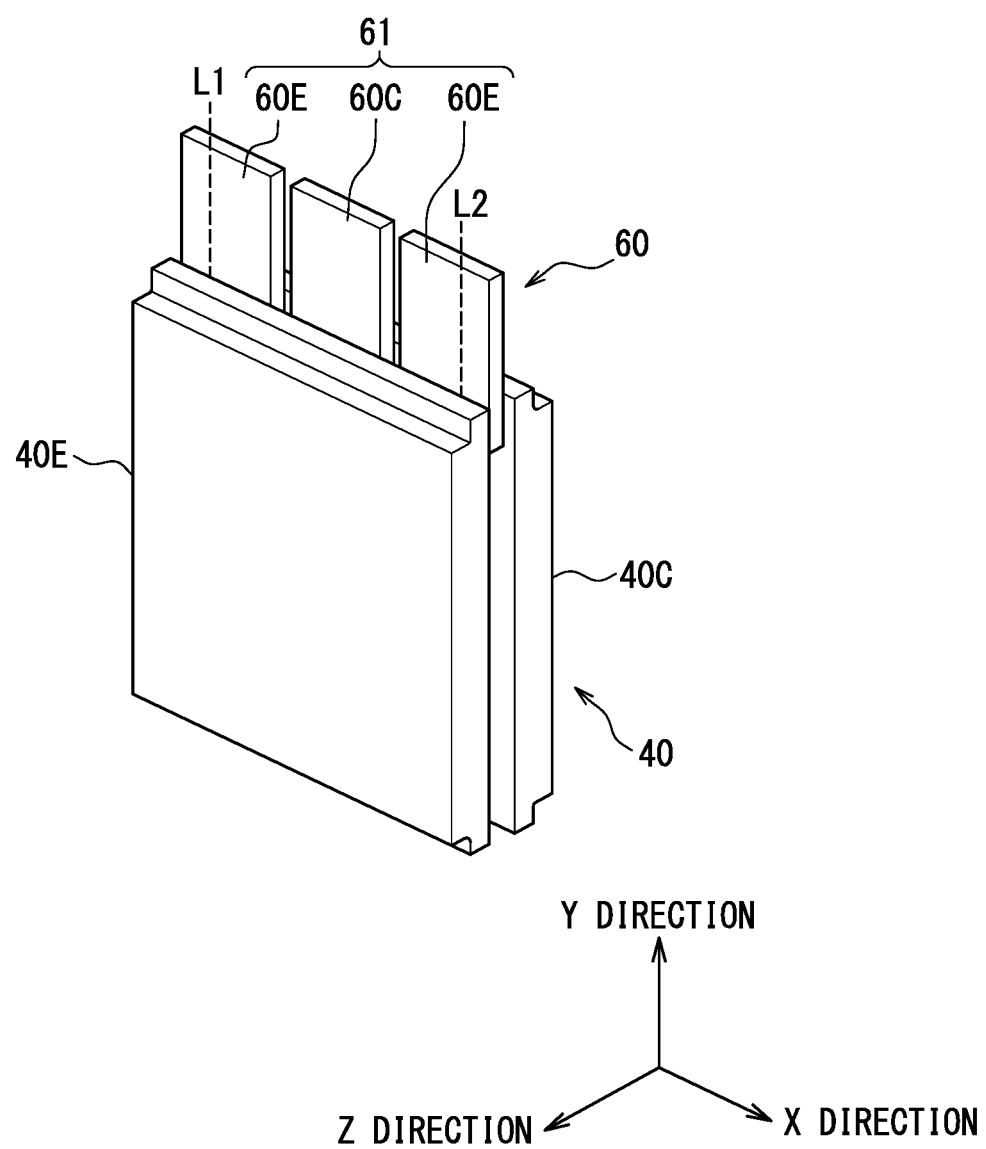
FIG. 8 is a perspective view showing a first modification.
Figure 9:
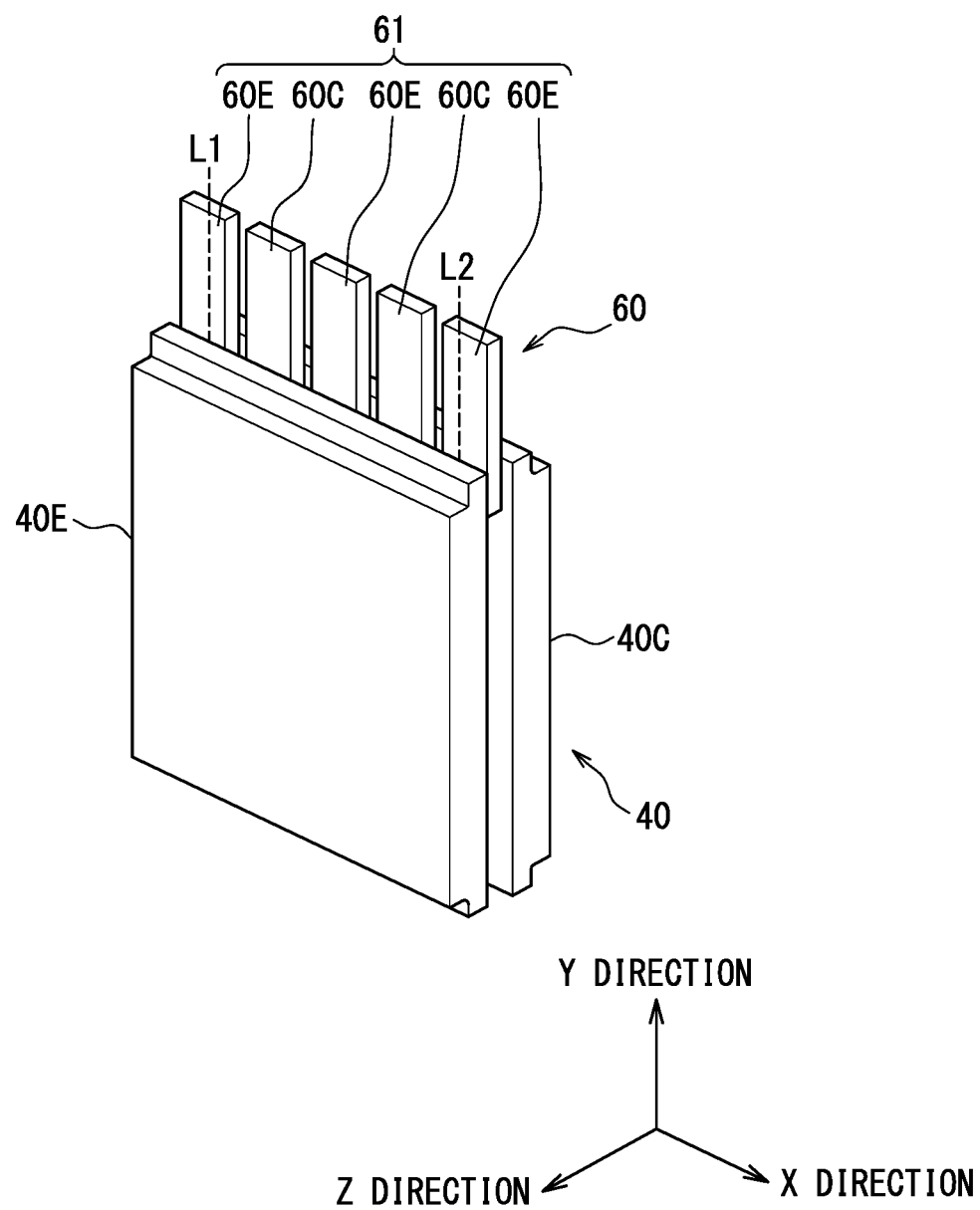
FIG. 9 is a perspective view showing a second modification.
Figure 10:
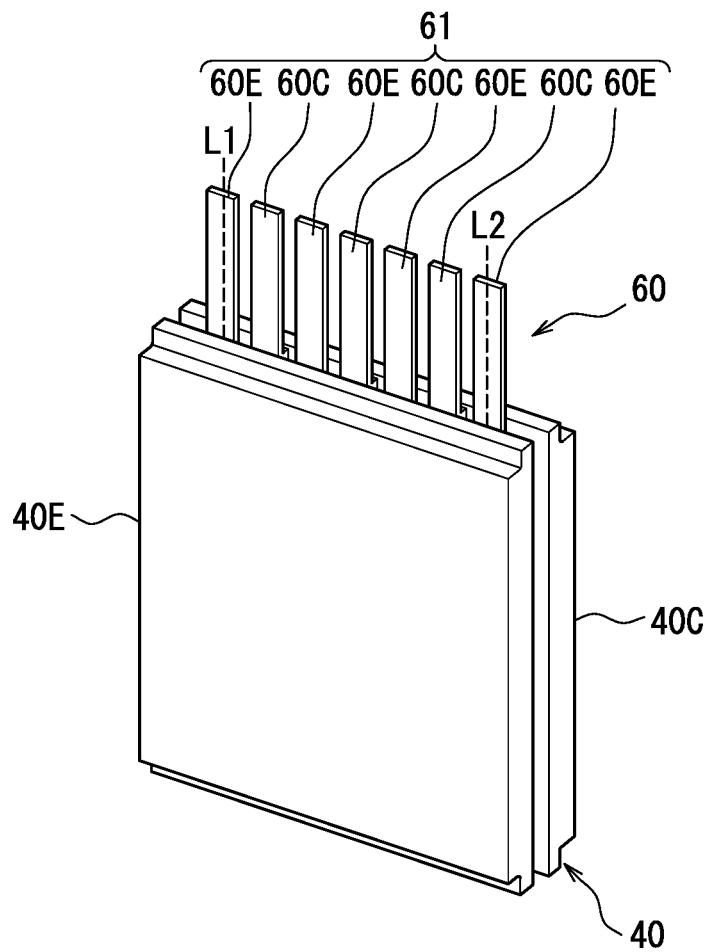
FIG. 10 is a perspective view showing a third modification.

The present embodiment has shown the example in which the odd number of main terminals 60 is nine. However, it is not limited to this. For example, configurations such as modification shown in FIGS. 8 to 10 may be employed. In FIGS. 8 to 10, for convenience, the sealing resin body 20 and the signal terminal 70 are not shown. In FIGS. 8 to 10, for convenience, the region A1 is not shown, and the extension lines L1 and L2 defining the region A1 are shown.

In the first modification shown in FIG. 8, the semiconductor device 10 includes three main terminals 60, specifically, one main terminal 60C and two main terminals 60E. That is, the semiconductor device includes two lateral surface facing portions. The main terminal group 61 includes all the main terminals 60. The main terminal 60C placed at the center is entirely placed, in the X direction, in the region A1 described above. The main terminals 60E at the both ends are partially placed in the region A1.

In the second modification shown in FIG. 9, the semiconductor device 10 includes five main terminals 60, specifically, two main terminals 60C and three main terminals 60E. That is, the semiconductor device includes four lateral surface facing portions. The main terminal group 61 includes all the main terminals 60. Each of the main terminals 60E at both ends is partially placed in the region A1. Each of the remaining three main terminals 60 is entirely placed in the region A1.

In the third modification shown in FIG. 10, the semiconductor device 10 includes seven main terminals 60, specifically, three main terminals 60C and four main terminals 60E. That is, the semiconductor device includes six lateral surface facing portions. The main terminal group 61 includes all the main terminals 60. Each of the main terminals 60E at both ends is partially placed in the region A1. Each of the remaining five main terminals 60 is entirely placed in the region A1.

Figure 11:
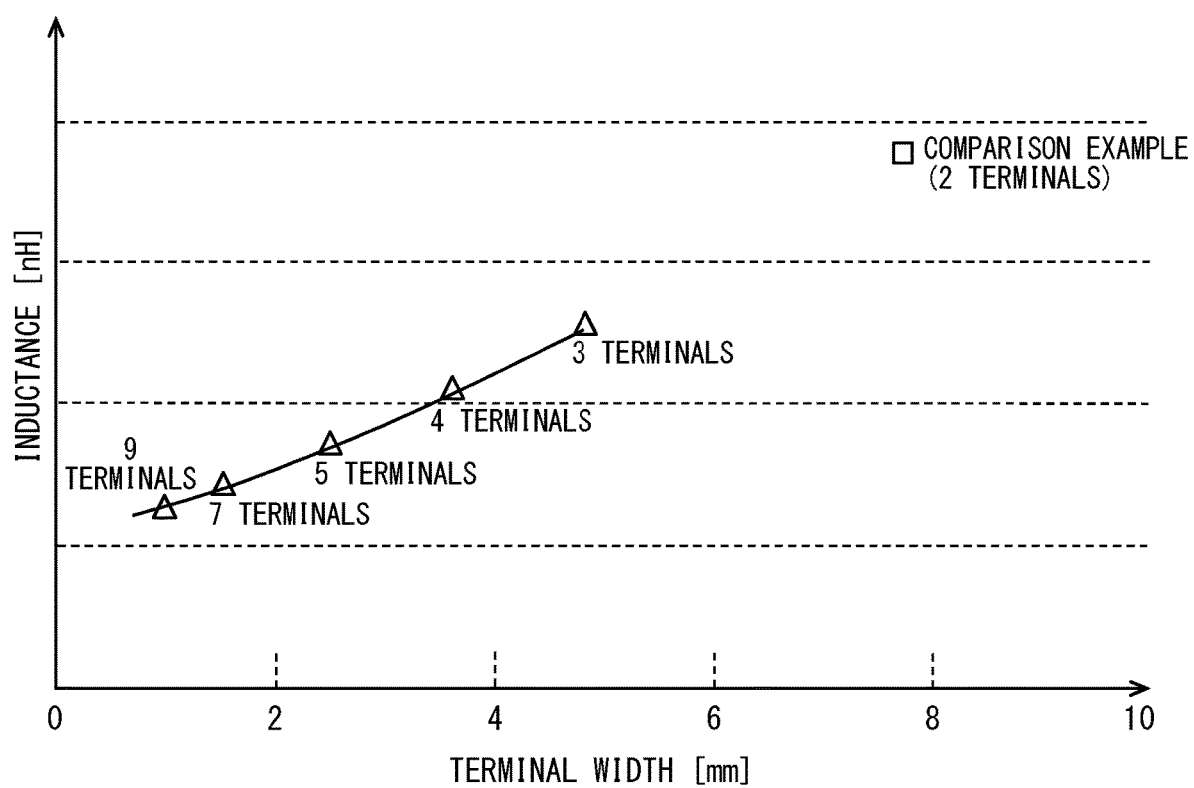
FIG. 11 is a diagram showing a magnetic analysis result of the total inductance of main terminals.

FIG. 11 a result obtained by performing a magnetic field analysis of a total inductance of the main terminals of the semiconductor device 10. In this magnetic field analysis (simulation), a length (width) of the conductive member 40 in the X direction was set to 17 millimeters, and the interval P1 of the main terminal 60 was set to 1.0 millimeter. In the main terminals 60 configuring the same semiconductor device 10, the widths W1 are set to be equal to each other. For example, when three main terminals 60 are provided, it is shown as three terminals in FIG. 11 FIG. 11 shows, as a comparative example, a configuration (two terminals) including only two main terminals. The nine terminals show a result of the same arrangement as that of the configuration (see FIG. 7) shown in the present embodiment. Similarly, the three terminals, the five terminals, the seven terminals respectively show results of the same arrangements of the configurations shown in the first modification (see FIG. 8), the second modification (see FIG. 9), and the third modification (see FIG. 10).

As the number of terminals increases, the width per terminal becomes narrower and the inductance (self-inductance) increases. However, the number of the lateral surface facing portions increases. The number of the main terminals 60 configuring the main terminal group 61 increases as the number of terminals increases up to the predetermined number of terminals. Therefore, it may be possible to reduce the inductance. As shown in FIGS. 8 to 10, when the number of terminals is three, five, or seven, the main terminal group 61 includes all the main terminal 60. That is, all the main terminals 60 are placed in the region A1. When the number of terminals is nine, as shown in FIG. 7, the main terminal group 61 includes seven main terminals 60.

From the results of FIG. 11, when the main terminal group 61 includes there or more main terminals 60, it is clear that the total inductance of the main terminals can be reduced as compared with the comparative example while the increase in the size is prevented. It is considered that, when the number of terminals is three or more, the above-described effect of reducing the inductance exceeds the increase in inductance due to the decrease in the width, and the inductance is reduced. In particular, when the main terminal group 61 includes five or more main terminals 60, the inductance can be reduced by half or less as compared with the comparative example. That is, it is clearly effective in reducing the inductance.

As described above, the nine terminals include the seven main terminals 60 configuring the main terminal group 61 and the two main terminals 60 placed outside the region A1. Although the two main terminals 60 are placed outside the region A1 in such a manner, more main terminals 60 than main terminals 60 that do not configure the main terminal group 61, that is, most of the main terminals 60 are placed in the region A1. The number of lateral surface facing portions is also two more as compared with the seven terminals. Accordingly, the inductance lower than that of the seven terminals is shown.

In the embodiment and the modifications described above, the example of the configuration in which the main terminals 60E are placed at both ends, that is, the configuration in which the number of main terminals 60E is larger than the number of main terminals 60C has been shown. However, it is not limited to this. In the configuration of the odd number of main terminals 60, the number of main terminals 60C may be larger than the number of main terminals 60E.

The example in which the lengths of the protrusion portions of all the main terminal 60 from the sealing resin body 20 are same has been shown. However, it is not limited to this. In consideration of connectivity with the bus bar or the like, the protrusion portions of the adjacent main terminals 60C and 60E may be different from each other. For example, in a fourth modification shown in FIG. 12, the main terminal 60C is longer than the main terminal 60E.

Figure 13:
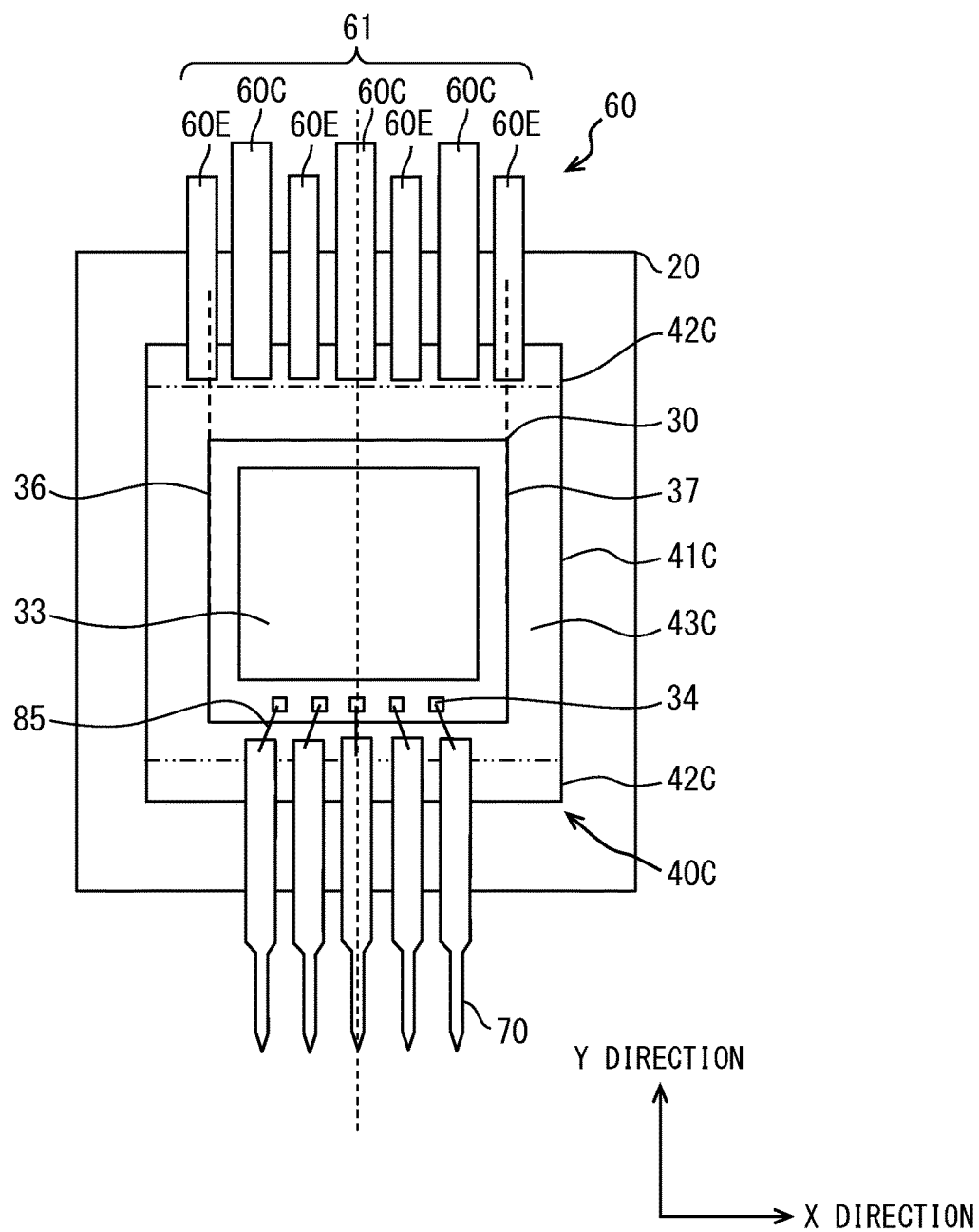
FIG. 13 is a plan view showing a fifth modification and corresponding to FIG. 7.

In a fifth modification shown in FIG. 13, the number of main terminals 60C is smaller than the number of main terminals 60E. A cross-sectional area of the main terminal 60C is larger than a cross-sectional area of the main terminal 60E. Thereby, the total impedance of the main terminal 60C and the total impedance of the main terminal 60E are substantially matched. Accordingly, it may be possible to suppress the heat generation of a small number of main terminals 60C. In FIG. 13, the cross-sectional area of the main terminal 60C is made larger than the cross-sectional area of the main terminal 60E by increasing the width. However, the thickness of the main terminal 60C may be thicker than that of the main terminal 60E. Both of the width and the thickness may be adjusted. In FIG. 13, the length of the small number of the main terminal 60C in the extension direction is longer than the length of the main terminal 60E. When the length is long, the cross-sectional area is large. Therefore, it may be possible to ensure the rigidity of the main terminal 60. FIG. 12 and FIG. 13 show the example of the seven terminals. However, it is not limited to this.

The example in which, at the protrusion portion from the sealing resin body 20, the adjacent main terminals 60C and 60E face each other entirely in the extension direction. However, it is not limited to this. At a part of the protrusion portion, the lateral surfaces may not face each other. For example, the protrusion tip portion of at least one of the main terminal 60C or the main terminal 60E is bent, and thereby the side surface may not face at the protrusion tip portion. Even when the extension lengths are the same, the connectivity with the bus bar or the like can be improved. However, the effect of reducing the inductance is reduced. The example in which the number of main terminals 60 is odd and the number of main terminals 60 configuring the main terminal group 61 is odd has been shown. However, it is not limited to this. The main terminal group 61 may include an even number of (four or more) main terminals 60.

It is sufficient that the semiconductor device 10 includes at least one IGBT 30. For example, in a configuration in which the semiconductor device 10 includes the IGBTs 30 and these IGBTs 30 are connected in parallel between the main terminals 60C and 60E, the above described arrangement of the main terminals 60 may be applied to each IGBT 30.

Figure 14:
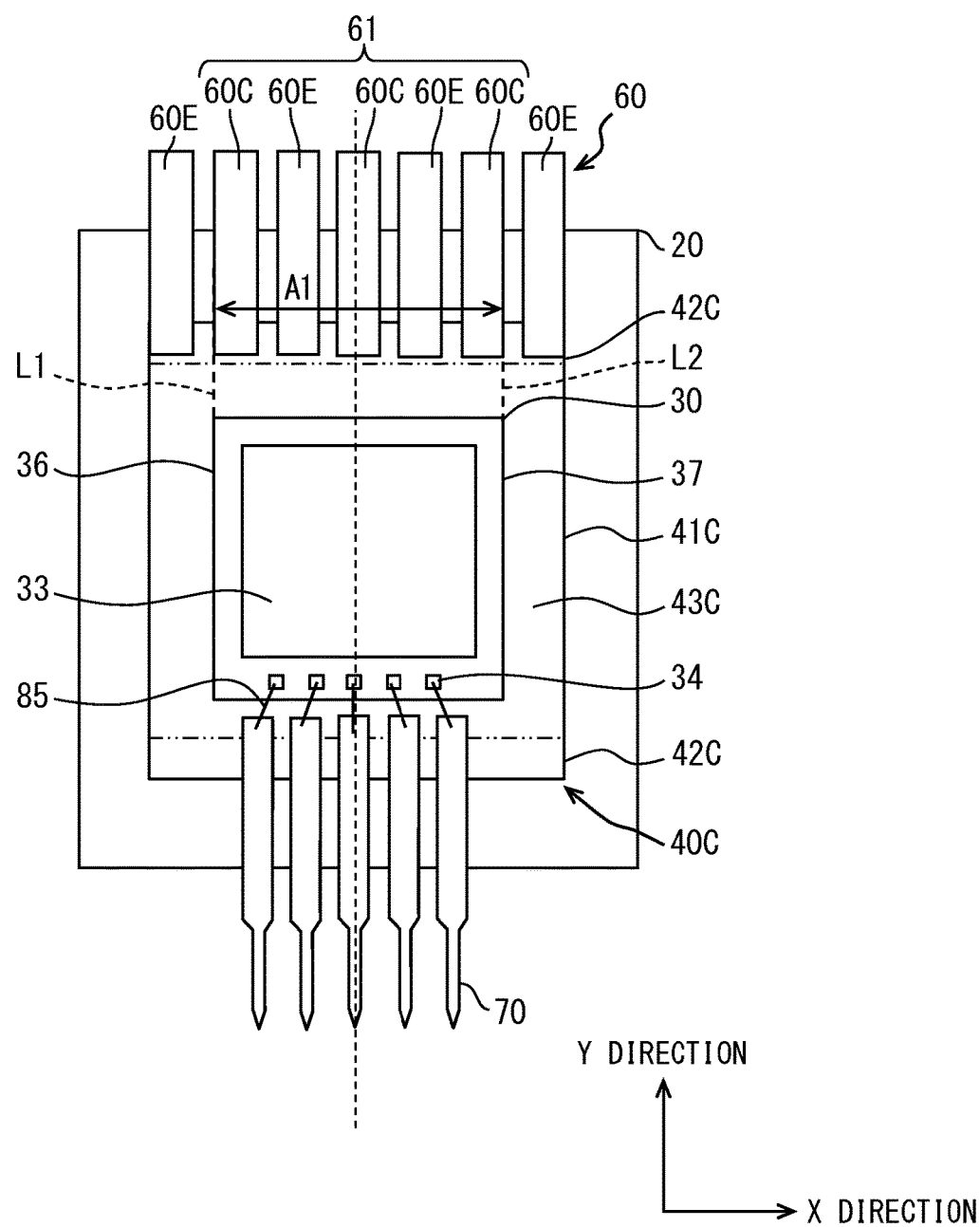
FIG. 14 is a plan view showing a sixth modification and corresponding to FIG. 7.

As shown in a sixth modification shown in FIG. 14, all the main terminals 60 configuring the main terminal group 61 are entirely in the region A1. It may be possible to simplify the current path with the main electrode of the IGBT 30. In FIG. 14, the main terminal group 61 includes five main terminals 60 among the seven main terminals 60. The five main terminals 60 configuring the main terminal group 61 are entirely placed in the region A1.

Second Embodiment

The present embodiment can refer to the preceding embodiment. Therefore, the descriptions of the same parts in the semiconductor device 10 shown in the preceding embodiment will be omitted.

The preceding embodiment has shown the example in which the semiconductor device 10 includes the odd number of (three or more) main terminals 60. On the other hand, the semiconductor device 10 in the present embodiment includes the even number of (four or more) main terminals 60. Other structures are similar to those in the precedent embodiment.

Figure 15:
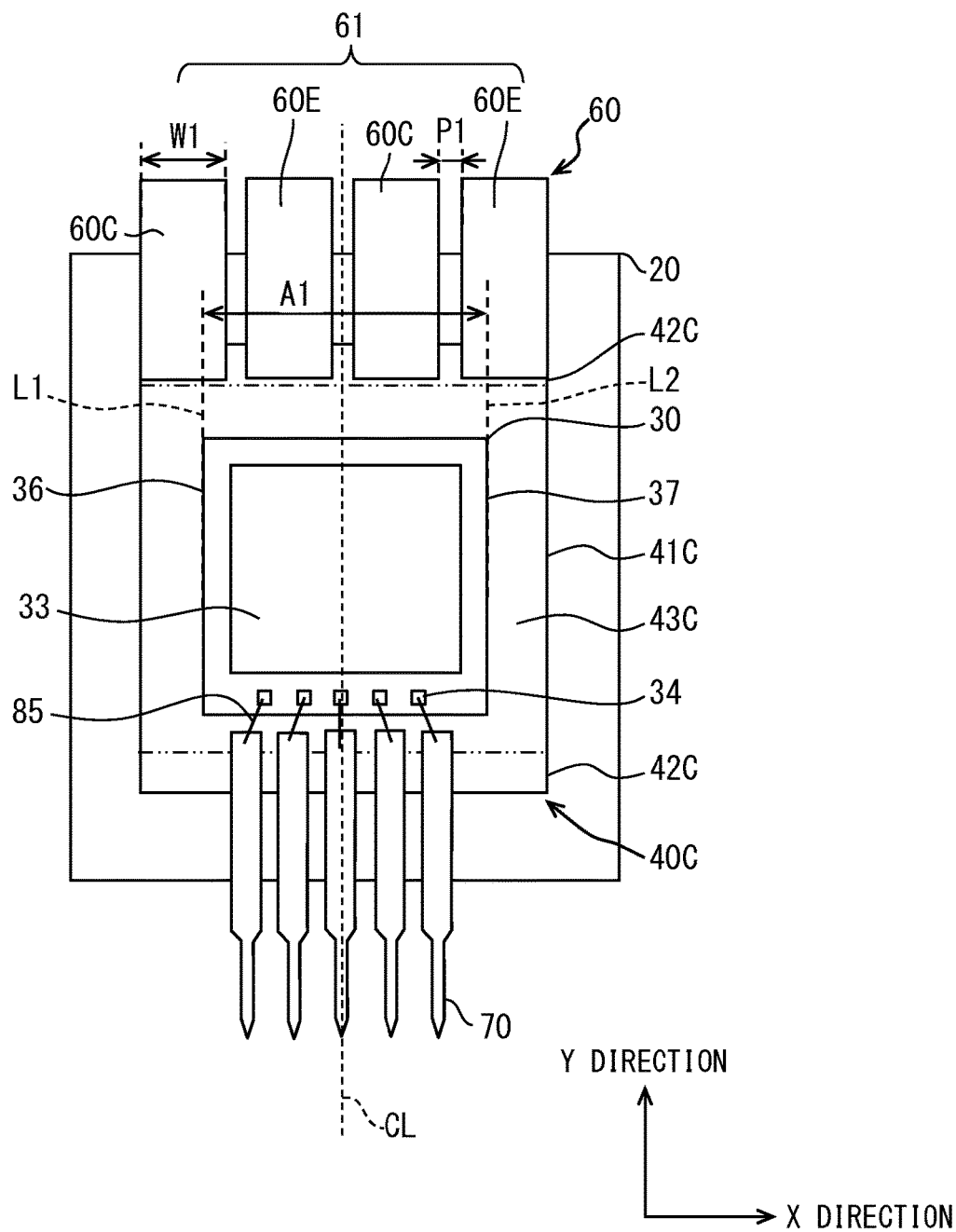
FIG. 15 is a plan view showing a semiconductor device according to a second embodiment and corresponding FIG. 7.

In an example shown in FIG. 15, the semiconductor device 10 includes four main terminals 60, specifically, two main terminals 60C and two main terminals 60E. The main terminals 60C and the main terminals 60E are alternately placed. The width W1 and the thickness of the four main terminals 60 are equal to each other. That is, the cross sectional areas orthogonal to the extension direction are equal to each other. The extension length in the Y direction of the four main terminals 60 is also equal to each other.

All the main terminals 60 configure the main terminal group 61. The two main terminals 60C and 60E placed at both ends are partially placed in the region A1 in the X direction. The two main terminals 60C and 60E at the center are entirely placed in the region A1 in the X direction.

Such the semiconductor device 10 can also achieve the similar effects to the preceding embodiments. Specifically, since the multiple lateral surface facing portions of the main terminals 60C and 60E are provided, it may be possible to effectively reduce the inductance. Since the main terminal group 61 is provided, it may be possible to simplify the current path between the main terminal 60 configuring the main terminal group 61 and the main electrode of the IGBT 30, and reduce the inductance. As described above, it may be possible to reduce the inductance of the main circuit wiring as compared with the conventional structure. FIG. 11 also shows the result of the four terminals. From the results of FIG. 11, even when the number of terminals is four, it is clear that the total inductance of the main terminals can be reduced as compared with the comparative example while the increase in the size is prevented.

In the present embodiment, all the main terminals 60 configure the main terminal group 61. Therefore, it may be possible to effectively reduce the inductance. Even when the number of main terminals 60 is an even number, it is sufficient that three or more continuously arranged main terminals 60 configure the main terminal group 61. Accordingly, in the configuration including the four main terminals 60, three main terminals 60 configure the main terminal group 61, and the remaining one main terminal 60 may be placed outside the region A1. As described above, when the number of main terminal 60 is the even number, the odd number of (three or more) main terminals 60 may configure the main terminal group 61.

In the present embodiment, when the number of main terminals 60 is the even number, the number of main terminals 60C and the number of main terminals 60E are same. Therefore, the main currents flowing at the main terminals 60C and 60E become equal. Thereby, it may be possible to suppress the variation in heat generation. In particular, in the present embodiment, the extension lengths of the main terminals 60C and 60E are equal, and the cross-sectional areas are equal. Thereby, the impedances of the main terminals 60C and 60E are substantially same. Accordingly, it may be possible to effectively prevent the variation in heat generation.

The example in which the number of main terminals 60 is four has been shown. However, it is not limited to this. It is sufficient that the number is the even number and is four or more. For example, a configuration including six main terminals 60 or a configuration including eight main terminals 60 may be employed.

As shown in the fourth modification and the fifth modification of the preceding embodiment, protrusion portions of the adjacent main terminals 60C and 60E may have different lengths. Further, the cross-sectional area of a main terminal having the longer protrusion portion among the main terminals 60C and 60E may be larger than the cross-sectional area of a main terminal having the shorter protrusion portion. Thereby, it may be possible to ensure the rigidity. Further, the impedances of the main terminal 60C and the main terminal 60E can be set to be equal to each other. As described in the preceding embodiment, at a part of the protrusion portion, the lateral surfaces may not face each other.

Third Embodiment

The present embodiment can refer to the preceding embodiments. Therefore, the descriptions of the same parts in the semiconductor device 10 shown in the preceding embodiment will be omitted.

In the present embodiment, as a part of the lead frame, a connection portion is further provided with at least one of the main terminal 60C or the main terminal 60E. At at least one of the main terminals 60C or 60E, the same main terminals are connected to each other by the connection portion.

Figure 16:
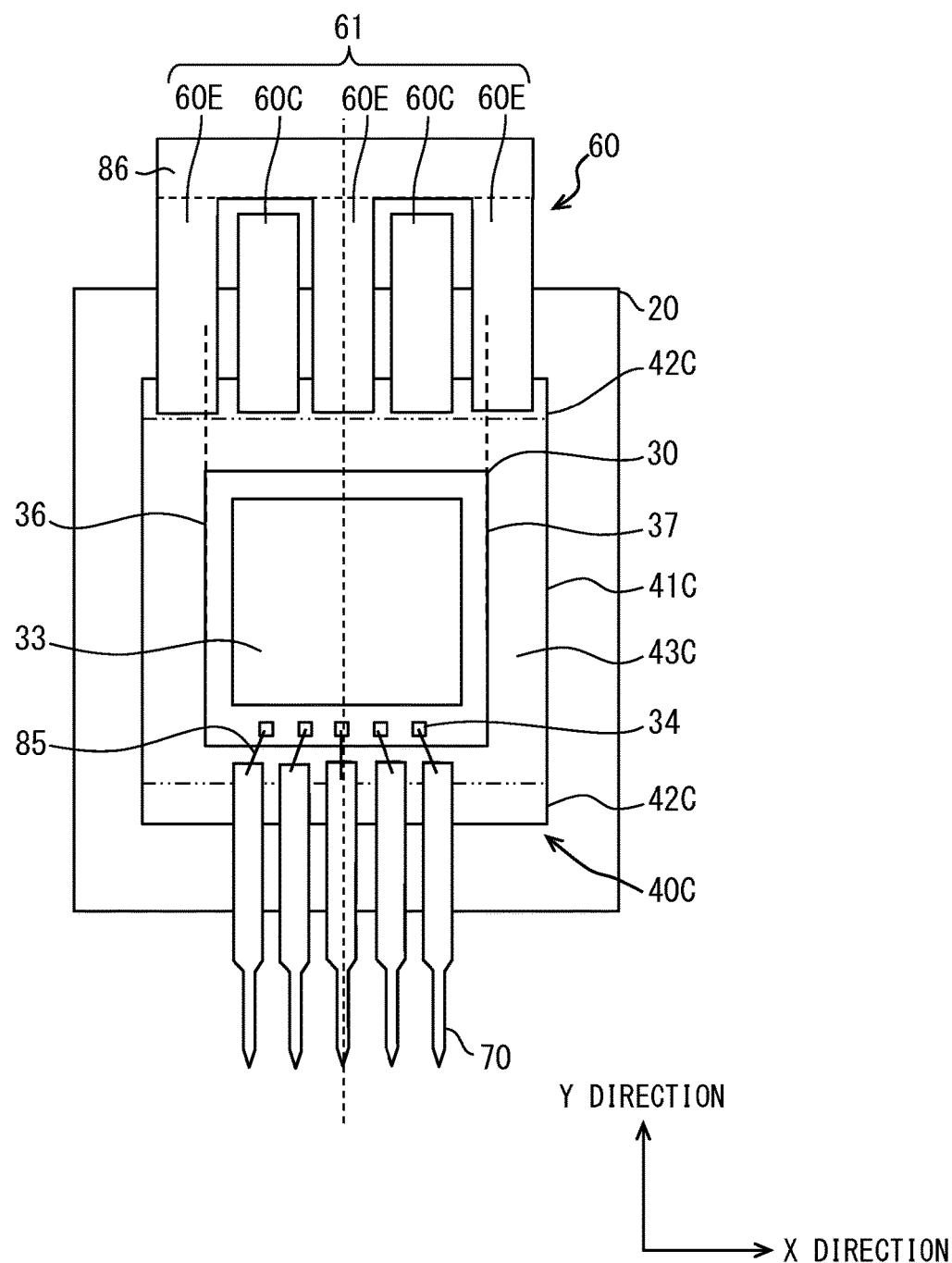
FIG. 16 is a plan view showing a semiconductor device according to a third embodiment and corresponding FIG. 7.

In an example shown in FIG. 16, the semiconductor device 10 includes five main terminals 60, specifically, two main terminals 60C and three main terminals 60E. The lead frame 90 described above has a connection portion 86 that connects the main terminals 60E to each other. The protrusion length in the main terminal 60E from the sealing resin body 20 is longer than that in the main terminal 60C. The connection portion 86 connects the protrusion tip portion of the main terminal 60E. The connection portion 86 extends in the X direction, and is placed apart from the main terminal 60C in the Y direction. The connection portion 86 is placed at the same position as that of the protrusion portions of the main terminals 60C and 60E in the Z direction.

In such a manner, the main terminal 60 (main terminal 60E) at the same potential is connected by the connection portion 86, and thereby it may be possible to reduce the number of connection points with the bus bar. That is, it may be possible to improve the connectivity. In particular, in FIG. 16, a large number of main terminals 60E are connected. Thereby, in the configuration in which the same lead frame 90 is provided with the main terminals 60C and 60E and the connection portion 86, it may be possible to reduce the connection point.

Instead of the main terminal 60E, the main terminal 60C may be connected to the connection portion 86. Of the main terminals 60C and 60E, the small number of terminals may be connected. The number of main terminals 60 and the arrangement are not limited to the example shown in FIG. 16. When the connection portion 86 is provided with the main terminal 60C or the main terminal 60E, the connection portion 86 can be placed so as to continue from the protrusion portion of the main terminals 60C and the 60E, as described above. It may be combined with a configuration including the even number of main terminals 60.

Figure 17:
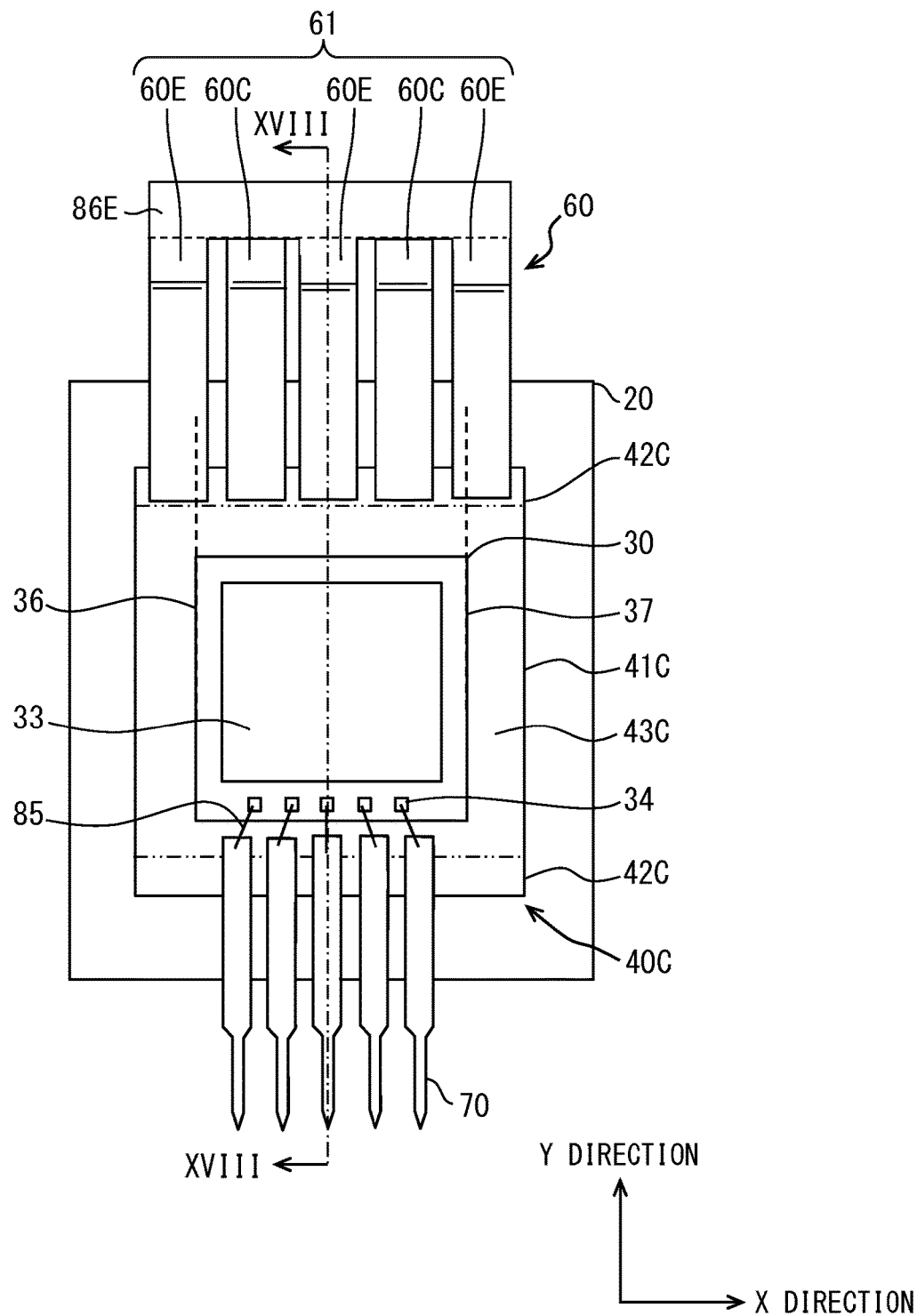
FIG. 17 is a cross-sectional view showing a seventh modification and corresponding to FIG. 3.
Figure 18:
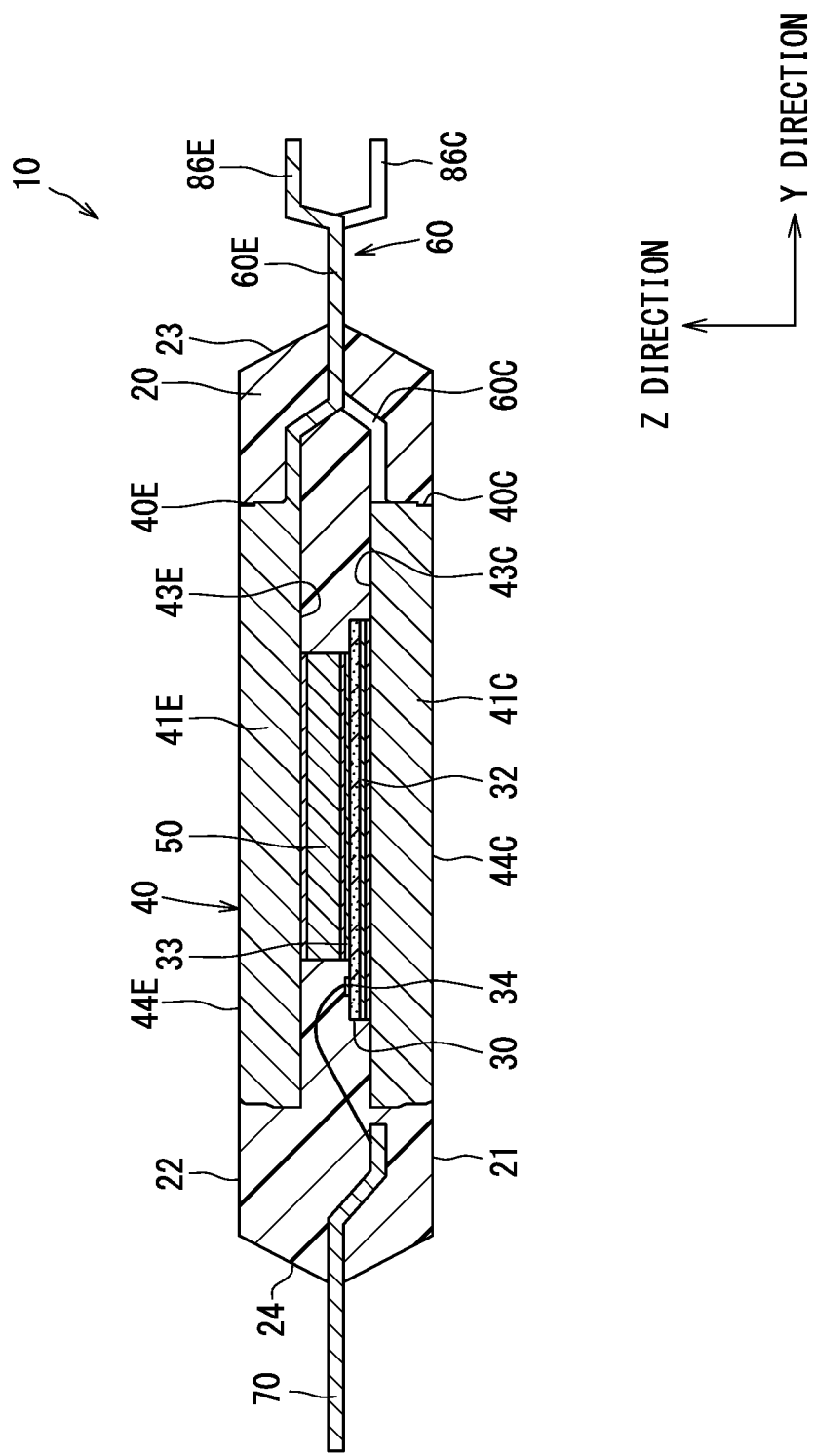
FIG. 18 is a cross-sectional view along a XVIII-XVIII line of FIG. 17.

Each of the main terminals 60C and 60E may be connected by the connection portion. In a seventh modification shown in FIG. 17 and FIG. 18, the conductive members 40C and 40E include the main portion 41C and does not include the extension portion 42C, and the conductive member 40E includes the main portion 41E and does not include the extension portion 42E. On the same lead frame, the conductive member 40C, the main terminal 60C, and the signal terminal 70 are placed. At a lead frame different from the lead frame including the main terminal 60C, the conductive member 40E and the main terminal 60E are configured. The main terminal 60C extends from the conductive member 40C, and the main terminal 60E extends from the conductive member 40E. FIG. 18 is a cross-sectional view of the semiconductor device 10 along the XVIII-XVIII of FIG. 17.

In a seventh modification, a connection portion 86C is placed on the lead frame close to the main terminal 60C, and a connection portion 86E is placed on the lead frame close to the main terminal 60E. The connection portion 86C connects the main terminals 60C to each other at the protrusion tip portions. The connection portion 86E connects the main terminals 60E to each other at the protrusion tip portions. The protrusion portion of each of the main terminals 60C and 60E has a bent portion. Thereby, the connection portions 86C and 86E are separated from each other in the Z direction. That is, the connection portions 86C and 86E are placed at different positions in the Z direction. Accordingly, even when the extension lengths are same, the main terminals 60C and the main terminal 60E are respectively connected by the connection portions 86C and 86E. It may be possible to further reduce the number of connection points.

Fourth Embodiment

The present embodiment can refer to the preceding embodiments. Therefore, the descriptions of the same parts in the semiconductor device 10 shown in the preceding embodiment will be omitted.

Figure 19:
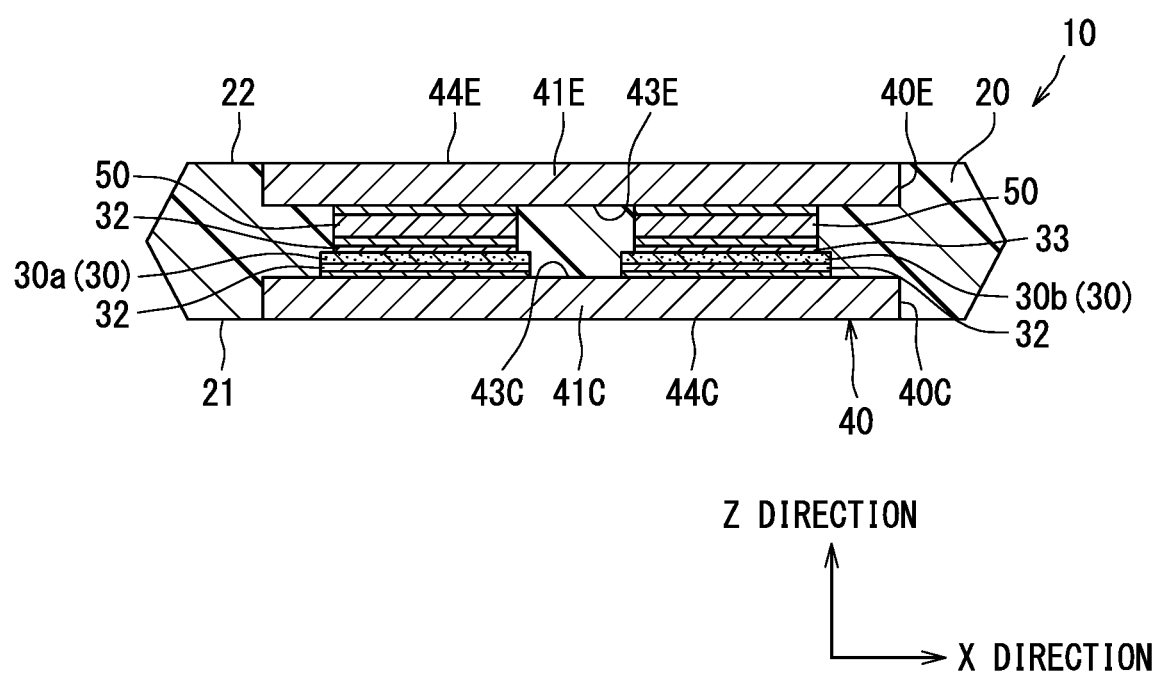
FIG. 19 is a cross-sectional view showing a semiconductor device according to a fourth embodiment along a XIX-XIX line of FIG. 20.

The semiconductor device 10 in the present embodiment includes multiple IGBTs 30. These IGBTs 30 are connected in parallel to each other between the main terminals 60C and 60E. That is, the multiple parallelly connected IGBTs 30 configure one arm. In examples shown in FIG. 19 and FIG. 20, the semiconductor device 10 includes, as the IGBT 30, an IGBT 30a corresponding to a first semiconductor element and an IGBT 30b corresponding to a second semiconductor element. FIG. 19 is a cross sectional view of the semiconductor device 10 corresponding to an XIX-XIX line shown in FIG. 20.

The collector electrodes 32 of the IGBTs 30a and 30b are connected to the mounting surface 43C of the same conductive member 40C. The emitter electrodes 33 of the IGBTs 30a and 30b are connected to the mounting surface 43E of the same conductive member 40E via the individually placed terminal 50. In the present embodiment, the two IGBTs 30a and 30b have substantially the same planar shape, specifically, the substantially rectangular planar shape, and has the same size and the same thickness. The IGBTs 30a and 30b are positioned at substantially the same height in the Z direction and are aligned side by side in the X direction.

In the present embodiment, a main terminal group 62 includes two or more main terminals 60 continuously arranged in the X direction. The semiconductor device 10 includes, as the main terminal group 62, a main terminal group 62a corresponding to the IGBT 30a and a main terminal group 62b corresponding to the IGBT 30b. The main terminal group 62a corresponds to a first group, and the main terminal group 62b corresponds to a second group.

At least a part of each main terminal 60 configuring the main terminal group 62a is placed in a region A1a between, in the X direction, extension lines L1a and L2a that extend from both end surfaces 36a and 37a of the IGBT 30a. At least a part of each main terminal 60 configuring the main terminal group 62b is placed in a region A1b between, in the X direction, extension lines L1b and L2b that extend from both end surfaces 36b and 37b of the IGBT 30b.

Figure 20:
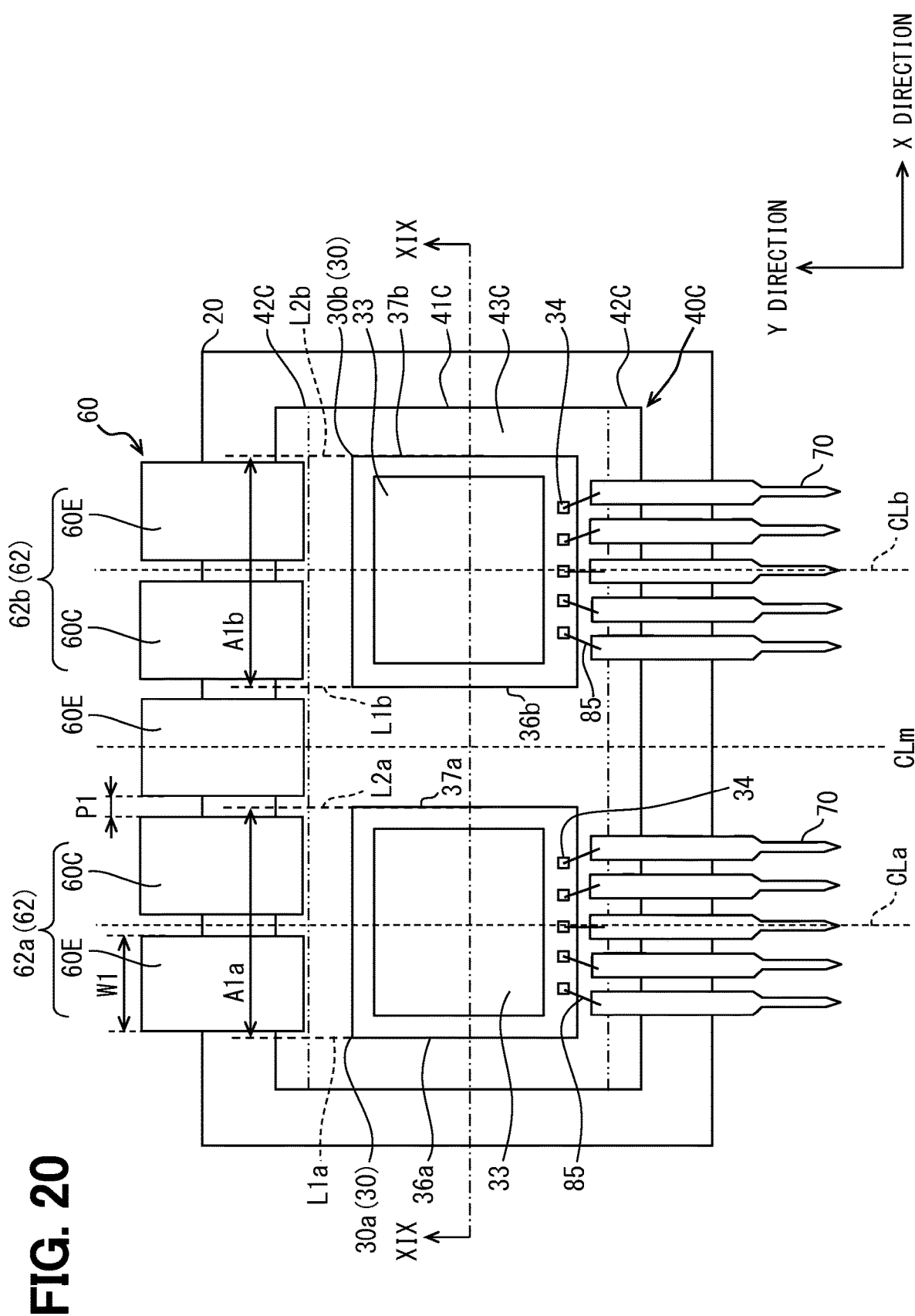
FIG. 20 is a plan view showing a positional relationship between an IGBT and a main terminal and corresponding FIG. 7.

In examples shown in FIG. 19 and FIG. 20, the semiconductor device 10 includes five main terminals 60. Specifically, the semiconductor device 10 includes two main terminals 60C and three main terminals 60E. The widths W1 of the main terminals 60 are equal to each other, the thicknesses of the main terminals 60 are equal to each other, and the intervals P1 of the main terminals 60 are equal to each other. The main terminal 60E in the middle is placed outside the regions A1a and A1b. The main terminal group 62a includes two main terminals 60C and 60E placed closer to the IGBT 30a than the main terminal 60E in the middle in the X direction. The main terminal group 62b includes two main terminals 60C and 60E placed closer to the IGBT 30b than the main terminal 60E in the middle.

Further, the main terminals 60C and 60E configuring the main terminal group 62a are entirely placed in the region A1a. Similarly, the main terminals 60C and 60E configuring the main terminal group 62b are entirely placed in the region A1b. The five main terminals 60 are symmetrically placed with respect to a center line CLm passing through an elemental center of the two IGBTs 30. The elemental center is a center position between the centers in the arrangement direction of the IGBTs 30a and 30b, the center line CLm is a virtual line that is orthogonal to the arrangement direction and passes through the elemental center line CL.

In the present embodiment, in the semiconductor device 10 connected to the multiple IGBTs 30 in parallel, the main terminal 60C and the main terminal 60E are alternately arranged. The lateral surfaces of the adjacent main terminals 60C and 60E face each other. In such a manner, the multiple side surface facing portions of the main terminals 60C and 60E, specifically, four multiple lateral surface facing portions are provided. Therefore, it may be possible to effectively reduce the inductance.

At least a part of each of the main terminals 60C and 60E configuring the main terminal group 62a is placed in the region A1a. Accordingly, it may be possible to simplify the current path between the main terminals 60C and 60E configuring the main terminal group 62a and the main electrode of the IGBT 30a, and thereby reduce the inductance. Similarly, at least a part of each of the main terminals 60C and 60E configuring the main terminal group 62b is placed in the region A1b. Accordingly, it may be possible to simplify the current path between the main terminals 60C and 60E configuring the main terminal group 62b and the main electrode of the IGBT 30b, and thereby reduce the inductance.

As described above, according to the semiconductor device 10 in the present embodiment, it may be possible to reduce the inductance of the main circuit wiring as compared with the conventional structure.

In particular, in the present embodiment, the odd number of main terminals 60 are symmetrically placed with respect to the center line CLm of the two IGBTs 30. In other words, the lateral surface facing portions are symmetrically placed with respect to the center line CLm. Therefore, the main currents of the IGBTs 30a and 30b flow in line symmetry with respect to the center line CLm. In other words, an inductance on the side of the IGBT 30a and an inductance on the side of the IGBT 30B are substantially equal. In such a manner, since the inductances are equal to each other, it may be possible to prevent current imbalance.

Although the example in which the two IGBTs 30 are connected in parallel, the present disclosure is not limited to the above example. The present disclosure is also applicable to a configuration in which three or more IGBTs 30 are connected in parallel.

The number of main terminals 60 is not limited to the examples described above. It is sufficient that each main terminal group 62 includes two or more main terminals 60 including the main terminals 60C and 60E. For example, seven main terminals 60 may be provided, and each of the main terminal groups 62a and 62b may include three main terminals 60.

The connection portion 86 (86C, 86E) shown in the third embodiment may be combined with the configuration shown in the present embodiment.

The disclosure of the present description is not restricted to the embodiments shown as examples. The disclosure encompasses the illustrated embodiments and variations based on the illustrated embodiments by those skilled in the art. For example, the disclosure is not limited to the combination of elements described in the embodiments. The disclosure may be implemented in various combinations. The disclosed technical scope is not limited to the description of the embodiments. The several technical ranges disclosed are indicated by the description of the claims, and should be construed to include all changes within the meaning and range equivalent to the description of the claims.

Although an example in which the semiconductor device 10 is applied to the inverter 5 has been described, the present disclosure is not limited to this example. For example, the present disclosure can be applied to a boost converter. The present disclosure can also be applied to both of the inverter 5 and the boost converter.

Although the example in which the IGBT 30 and the FWD 35 are integrally formed, the present disclosure is not limited to this above example. The IGBT 30 and the FWD 35 may be formed on separate chips.

Although the example of the IGBT 30 has been shown as the semiconductor element, the present disclosure is not limited to this example. For example, a MOSFET can be employed.

Although the example in which at least one terminal 50 is provided as the semiconductor device 10 having a double-sided heat dissipation structure has been described, the present disclosure is not limited to this example. The terminal 50 may not be provided. For example, instead of the terminal 50, a protrusion portion protruding toward the emitter electrode 33 may be provided on the conductive member 40E.

In addition, the example in which the heat radiation surfaces 44C and 44E are exposed from the sealing resin body 20 has been shown. However, the heat radiation surfaces 44C and 44E may not be exposed from the sealing resin body 20. For example, the heat radiation surfaces 44C and 44E may be covered with an insulation member (not shown). The sealing resin body 20 may be molded in a state where the insulation material is attached to the heat radiation surfaces 44C and 44E.

In the above, the embodiments, the configurations, the aspects of the semiconductor device according to the present disclosure are exemplified. The present disclosure is not limited to the above-described embodiments, each configuration and each aspect related to the present disclosure. For example, embodiments, configurations, and aspects obtained from an appropriate combination of technical elements disclosed in different embodiments, configurations, and aspects are also included within the scope of the embodiments, configurations, and aspects of the present disclosure.

The invention claimed is:

1. A semiconductor device configuring one arm of an upper-lower arm circuit, the semiconductor device comprising:
    at least one semiconductor element that includes a first main electrode and a second main electrode;
    a plurality of main terminals that include two or more first main terminals connected to the first main electrode and two or more second main terminals connected to the second main electrode; and
    at least one signal electrode,
    wherein:
    a main current flows between the first main electrode and the second main electrode and through each of the plurality of main terminals;
    each of the at least one signal terminal is (1) connected, by a bonding wire, to a pad on the at least one semiconductor element and (2) electrically separated from the plurality of main terminals;
    the two or more first main terminals and the two or more second main terminals alternate adjacent to each other;
    a lateral surface of the each of the two or more first main terminals faces a lateral surface of an adjacent second main terminal of the two or more second main terminals in one direction orthogonal to a thickness direction of the semiconductor element;
    a main terminal group includes a subset of the plurality of main terminals that are continuously arranged in the one direction;
    the main terminal group includes four or more of the plurality of main terminals, including at least two of the two or more first main terminals and at least two of the two or more second main terminals; and
    at least a part of each of the four or more of the plurality of main terminals in the main terminal group is in a region defined, in the one direction, by end surfaces of the semiconductor element.

2. The semiconductor device according to claim 1, wherein:
    some of the four or more of the plurality of main terminals in the main terminal group are entirely in the region; and at least another of the four or more of the plurality of main terminals in the main terminal group is partially in the region.

3. The semiconductor device according to claim 1, wherein:
each of the plurality of the four or more main terminals in the main terminal group is entirely in the region.

4. The semiconductor device according to claim 1, wherein:
the plurality of main terminals is an odd number of the main terminals.

5. The semiconductor device according to claim 4, wherein:
the two or more first main terminals and the two or more second main terminals are symmetrical with respect to a center line passing through a center of the semiconductor element in the one direction.

6. The semiconductor device according to claim 4, wherein:
one of the two or more first main terminals or the two or more second main terminals has a smaller number of terminals than another of the two or more first main terminals or the two or more second main terminals, and
a cross-sectional area of each of the one of the two or more first main terminals or the two or more second main terminals having the smaller number of terminals is larger than a cross-sectional area of each of the another of the two or more first main terminals or the two or more second main terminals.

7. The semiconductor device according to claim 6, wherein:
an extension length of the each of the one of the two or more first main terminals or the two or more second main terminals having the smaller number of terminals is longer than an extension length of the each of the another of the two or more first main terminals or the two or more second main terminals.

8. The semiconductor device according to claim 1, wherein:
the plurality of main terminals is an even number of the main terminals.

9. The semiconductor device according to claim 8, wherein:
an extension length of each of the two or more first main terminals is equal to an extension length of each of the two or more second main terminals; and
a cross-sectional area of the each of the two or more first main terminals is equal to a cross-sectional area of the each of the two or more the second main terminals.

10. The semiconductor device according to claim 1, wherein:
the main terminal group includes five or more main terminals.

11. The semiconductor device according to claim 1, wherein:
the main terminal group includes all of the plurality of main terminals.

12. The semiconductor device according to claim 1, further comprising:
a connection portion that is a part of a lead frame with at least one of the two or more first main terminals or the two or more second main terminals,
wherein:
a set of the plurality of main terminals from the two or more first main terminals or the two or more second main terminals are connected to each other by the connection portion.

13. The semiconductor device according to claim 1, wherein the main terminal group includes less than all of the plurality of main terminals.

14. The semiconductor device according to claim 1, wherein:
each of the two or more first main terminals and each of the two or more second main terminals have a connection portion that connects to an internal conductive member; and
the connection portion of the each of the two or more first main terminals is in different planes than the connection portion of the each of the two or more second main terminals in the thickness direction.

15. A semiconductor device configuring one arm of an upper-lower arm circuit, the semiconductor device comprising:
a plurality of semiconductor elements that includes at least a first semiconductor element and a second semiconductor element;
a plurality of main terminals;
at least one signal terminal; and
a connection portion,
wherein:
each of the plurality of semiconductor elements includes a first main electrode and second main electrode;
a main current flows between the first main electrode and the second main electrode and through each of the plurality of main terminals;
the plurality of main terminals includes two or more first main terminals connected to the first main electrode and two or more second main terminals connected to the second main electrode;
each of the at least one signal terminal is (1) connected, by a binding wire, to a pad on the plurality of semiconductor elements and (2) electrically separated from the plurality of main terminals;
the two or more first main terminals and the two or more second main terminals alternate adjacent to each other;
a lateral surface of the each of the two or more first main terminals faces a lateral surface of an adjacent second main terminal of the two or more the second main terminals in one direction orthogonal to a thickness direction of the semiconductor element;
the first semiconductor element and the second semiconductor element are spaced in the one direction and are connected in parallel between the two or more first main terminals and the two or more second main terminals;
a main terminal group includes a subset of the plurality of main terminals that are continuously arranged in the one direction;
the main terminal group includes four or more of the plurality of main terminals in a first group and a second group;
at least a part of each of the plurality of main terminals in the first group is in a first region defined, in the one direction, by end surfaces of the first semiconductor element;
at least a part of each of the plurality of main terminals in the second group is in a second region defined, in the one direction, by end surfaces of the second semiconductor element;

the connection portion is a part of a lead frame with at least one of the two or more first main terminals or the two or more second main terminals; and a set of the plurality of main terminals from the two or more first main terminals or the two or more second main terminals are connected to each other by the connection portion.

16. The semiconductor device according to claim 15, wherein the main terminal group includes less than all of the plurality of main terminals.

17. The semiconductor device according to claim 15, wherein:

each of the two or more first main terminals and each of the two or more second main terminals have a connection portion that connects to an internal conductive member; and the connection portion of the each of the two or more first main terminals is in different planes than the connection portion of the each of the two or more second main terminals in the thickness direction.

* * * * *